United States Patent
Tanaka et al.

(10) Patent No.: US 9,230,993 B2
(45) Date of Patent: Jan. 5, 2016

(54) DISPLAY APPARATUS AND MANUFACTURING METHOD OF THE SAME

(71) Applicant: NLT TECHNOLOGIES, LTD., Kawasaki, Kanagawa (JP)

(72) Inventors: Jun Tanaka, Kawasaki (JP); Nobuya Seko, Kawasaki (JP); Kenichi Hayashi, Kawasaki (JP)

(73) Assignee: NLT TECHNOLOGIES, LTD., Kanagawa (JP)

(*) Notice: Subject to any disclaimer, the term of this patent is extended or adjusted under 35 U.S.C. 154(b) by 0 days.

(21) Appl. No.: 14/449,889

(22) Filed: Aug. 1, 2014

(65) Prior Publication Data

US 2015/0041818 A1  Feb. 12, 2015

(30) Foreign Application Priority Data

Aug. 6, 2013 (JP) .................................. 2013-163417
May 9, 2014 (JP) .................................. 2014-097593

(51) Int. Cl.
| H01L 27/14 | (2006.01) |
| H01L 27/12 | (2006.01) |
| H01L 29/786 | (2006.01) |

(52) U.S. Cl.
CPC .......... *H01L 27/1222* (2013.01); *H01L 27/124* (2013.01); *H01L 27/127* (2013.01); *H01L 29/78633* (2013.01)

(58) Field of Classification Search
CPC .............. H01L 27/1222; H01L 27/127; H01L 29/78621; H01L 27/1214; H01L 27/3244; H01L 2029/7863; H01L 27/3262; H01L 27/14692; H01L 27/124; H01L 29/78633

USPC ............................................. 257/72; 438/151
See application file for complete search history.

(56) References Cited

U.S. PATENT DOCUMENTS

| 5,412,493 A * | 5/1995 | Kunii et al. .................... 349/43 |
| 2002/0139980 A1* | 10/2002 | Yamazaki ....................... 257/72 |
| 2003/0057419 A1* | 3/2003 | Murakami et al. ............. 257/72 |
| 2003/0100150 A1* | 5/2003 | Kitakado et al. ............. 438/151 |

FOREIGN PATENT DOCUMENTS

| JP | 7-253593 A | 10/1995 |
| JP | 9-230373 A | 9/1997 |
| JP | 2002-111001 A | 4/2002 |
| JP | 2005-195891 A | 7/2005 |

* cited by examiner

*Primary Examiner* — Duy T Nguyen
(74) *Attorney, Agent, or Firm* — Sughrue Mion, PLLC

(57) ABSTRACT

Provided are a display apparatus and a manufacturing method of the same. The display apparatus includes: a counter substrate, and an active matrix substrate including a pixel area. The active matrix substrate includes, in a non-transmissive region of each pixel, a transparent substrate, a polycrystalline silicon film, a gate insulating film, a gate electrode, an interlayer insulating film, and a drain layer including patterned conductive films, and includes, in a transparent region of each pixel, the transparent substrate, the gate insulating film and the interlayer insulating film. The interlayer insulating film includes zones where the interlayer insulating film is thinner than a part of the interlayer insulating film at the middle of each transmissive region. The zones are each located so as to extend between the neighboring patterned conductive films and are further located so as not to overlap with the transmissive regions and regions laid over LDD portions of the polycrystalline silicon film.

9 Claims, 14 Drawing Sheets

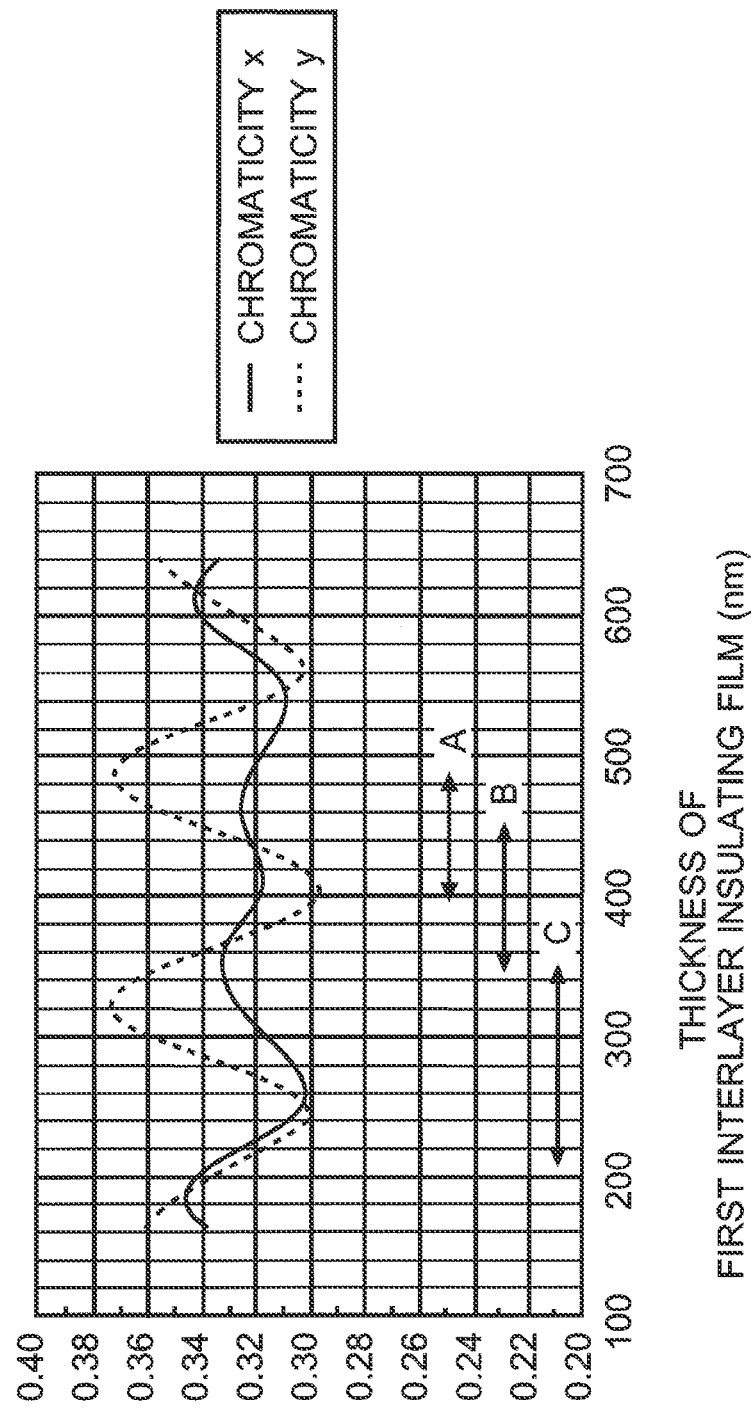

DISPLAY APPARATUS AND MANUFACTURING METHOD OF THE SAME

TECHNICAL FIELD

The present invention relates to a display apparatus and a manufacturing method of the display apparatus, in particular, relates to a display apparatus using an active matrix type thin-film transistor substrate which employs a semiconductor thin-film transistor as a switching element, and to a manufacturing method of the display apparatus.

BACKGROUND

In recent years, active matrix display apparatuses, such as a liquid crystal display apparatus and AMOLED (Active Matrix Organic Light Emitting Diode), have been developed actively and put in practical use. In particular, large volume and high resolution active matrix display apparatuses have been attracting attention, and the number of pixels used in such an apparatus has been increasing steadily. Further, with the development, a distance between adjoining pixels has been made remarkably narrow, and the narrowing technique has been developed.

Generally, these display apparatuses are manufactured in such a way that a process of forming a thin film on a substrate, such as glass, a photolithography process of forming a pattern on a photoresist, and an etching process of executing etching processing along the photoresist including the formed pattern are repeated by a number of times. With the narrowing of pixels in recent years, etching is needed to be performed with higher processing accuracy. In particular, in a display apparatus with a minimum space less than 4 µm, a process is essential to be performed with dry etching which causes the reduced amount of side etching and has high processing accuracy.

Further, the narrowing of pixels increases the frequency with which even comparatively-small particles conventionally having not caused any problems cause fatal defects. In particular, particles having been generated in a photolithography process cause a defective pattern. Successively, at the following etching process, since etching processing is executed along this defective pattern, a short circuit may be caused between the same layers. However, it is very difficult to remove thoroughly particles generated in the photolithography process.

Then, in order to suppress the occurrence of a short circuit between the same layers, the photolithography process and the etching process have been performed several times for a target film. For example, Japanese Patent Application Laid-Open Publication (JP-A) No. H07-253593 discloses the following processing about forming patterned electrode structures composed of signal wires, a drain portion, and a storage capacitance portion. At the time of the processing, a metal film expected to become the electrodes is formed, and then, the first photolithography and etching processing are executed on the metal film, and thereafter, the second photolithography and etching processing are executed so as to form patterned structures slightly larger than the patterned structures formed at the time of the first photolithography, whereby it is intended to prevent a short circuit in a part of the electrodes, to reduce point defects greatly, to improve the display performance, and to increase the manufacturing yield. In the case of JP-A No. H07-253593, the target film is a drain layer.

Further, JP-A No. H09-230373 discloses the following processing. On a gate electrode formed on a glass substrate, a gate insulating film, an a-Si film, and an n⁺a-Si film are sequentially laminated, and, patterned structures are formed by the first photolithography. Thereafter, the n⁺a-Si film, the a-Si film, and the gate insulating film are removed by dry etching, and on the upper portion of the resulting structure, a Cr film is formed. Successively, on the Cr film, patterned structures are formed by photolithography, to form a drain electrode. Then, by utilizing the drain electrode as a mask, the n⁺a-Si film, the a-Si film, and the gate insulating film which have not been removed by the first photolithography are removed by dry etching. In the case of JP-A H09-230373, the target films are the n⁺a-Si film, the a-Si film, and the gate insulating film.

Furthermore, JP-A No. 2002-111001 discloses the following processing for a liquid crystal display apparatus in which a top-gate TFT (Thin-Film Transistor) using a polycrystalline silicon thin film in an active layer is employed as a switching element. In the processing, a first photolithography process and an etching process are performed on a metal film on a gate insulating film, and a first photolithography process and a dry etching process are further performed on the remaining metal film with the residue which has not been removed in the first photolithography process and the etching process so as to hold portions corresponding to the form of a gate electrode, the wiring form of a scanning line, the wiring form of an auxiliary capacity line, and the form of a polycrystalline silicon thin film portion and to remove the other part of the metal film. In the case of JP-A No. 2002-111001, the target film is the metal film corresponding to the gate electrode.

In the above-described three articles, dry etching is performed two times in total for the almost entire of the transmissive regions of a display apparatus. Further, in the above-described three articles, the photolithography process and etching process at the second time or the following time are executed for the outside of the TFT. Accordingly, for a portion between a source and a drain on the TFT, the photolithography process and etching process are executed only one time.

On the other hand, in JP-A No. 2005-195891, it is known that color tone of display, i.e., chromaticity changes depending on the thickness of a transparent insulating film. According to FIG. 2 of JP-A No. 2005-195891, chromaticity changes with a period of about 0.2 µm of an insulating film thickness.

However, in the structure or manufacturing method in JP-A Nos. H07-253593, H09-230373 and 2002-111001, although defects due to a short circuit between the same layers of a conductive layer may be prevented, the following two problems take place.

The first problem is a point that the display quality of a display apparatus, in particular, chromaticity at the time of displaying white changes, and a point that a difference occurs in a level of the change depending on a position in a display area or a position in a substrate. The reasons are that an amount of change in the thickness of an insulating film in each transmissive region becomes large due to dry etching performed two times in total for the almost entire of the transmissive regions of a display apparatus, and that a difference in the amount of change of the thickness depending on a position in the substrate surface becomes large in association with it. In particular, in RIE (Reactive Ion Etching) having been used well as dry etching with less side-etched portions, since ions are accelerated at the time of entering a substrate, not only a conductive layer being a processing target, but also, its undercoat insulating film is etched, which necessarily causes excavation into the undercoat insulating film. Accordingly, the thickness of the undercoat insulating film may change. Further, since dispersion exists in an etching rate within a substrate surface, a difference in an amount of change of the thickness of the undercoat insulating film becomes larger depending on a position in the substrate surface.

Here, a change of the thickness of an undercoat insulating film is estimated in the following process model. For example, if an aluminum film (Al film) (with a thickness of 400 nm) on a silicon oxide film ($SiO_2$ film) with a thickness of 440 nm±44 nm is processed by dry etching with an etching rate dispersion of ±15%, a selection ratio of 5, and an over etching ratio of 50%, the $SiO_2$ film is excavated by 40 nm (=400 nm×0.5/5)±6 nm, the thickness of the $SiO_2$ film becomes thin to 400 nm±50 nm, and a range of the film thickness dispersion is expanded. In addition, if the second photolithography and dry etching process are performed in order to prevent a short circuit between the same layers of an Al film, an amount of excavation into the $SiO_2$ film further increases. This is because, in order to separate securely a portion having been not separated at the time of the first dry etching by the second dry etching, it is necessary to perform the second dry etching for the almost same time period as the first dry etching. Therefore, the surface of the $SiO_2$ film of a portion having been normally separated at the time of the first dry etching is etched from the start time of the second dry etching, and then, an amount of excavation into the $SiO_2$ film further increases. In the above example, by the second dry etching, the $SiO_2$ film is further excavated by 120 nm (=400 nm×(1+0.5)/5)±18 nm, that is, excavated by 160 nm±24 nm in total. This is a value almost equivalent to the period of the insulating film according to FIG. 2 of JP-A No. 2005-195891, and the chromaticity of a display apparatus using this insulating film is made to change greatly. In the above example, it would be estimated that the $SiO_2$ film becomes thin finally up to 280 nm±68 nm and a range of film thickness dispersion is made to expand.

With regard to chromaticity when white is displayed by a display apparatus which uses this silicon oxide film ($SiO_2$ film) for transmissive regions of an active matrix substrate, an optical simulation has been used to analyze how the chromaticity changes due to a change of the thickness of the $SiO_2$ film, and FIG. 1 illustrates an example of the result of the analysis. The film constitution of the transmissive regions was made nine layers based on the supposition of a top-gate TFT having used a polycrystalline silicon thin film for an active layer as shown in TABLE 1, and was defined such that the top and bottom of them are sandwiched by air layer. These nine layers was configured such that on a glass substrate (Layer 1), undercoat films (Layer 3, Layer 4) composed of silicon nitride (SiNx) and silicon oxide ($SiO_2$) were disposed, then, thereon, a gate insulating film (Layer 5) composed of silicon oxide ($SiO_2$), a first interlayer insulating film (layer 6) composed of silicon oxide ($SiO_2$), a second interlayer insulating film (Layer 7) composed of silicon nitride (SiNx), further, an organic layer (Layer 8), and an ITO (Indium Tin Oxide) film (Layer 9) were laminated. Here, in order to adjust the absorption coefficient of the glass substrate, Layer 2 of BK7 was inserted. Among them, by changing the thickness of the first interlayer insulating film (Layer 6) in a range of from 160 to 640 nm, the optical simulation was performed so as to obtain a change of the chromaticity. In its calculation method, the transmittance when light rays of red (R), green (G), and blue (B) being three primary colors of light pass through a film constituted as shown in TABLE 1 was obtained while changing the thickness of the Layer 6, and then, from these, the chromaticity coordinates (the xyY color coordinate system) x and y at the time of displaying white were obtained, and plotted as illustrated in FIG. 1. As illustrated in FIG. 1, in a range of 160 nm to 640 nm of the thicknesses of the Layer 6, the chromaticity x has changed in a range of 0.30 to 0.35, and the chromaticity y has changed in a range of 0.30 to 0.37. Further, the fluctuation period of the chromaticity y was about 160 nm. Further, at the lower portion of FIG. 1, three thickness dispersion ranges A to C are indicated with respective arrow heads based on the example of the above-mentioned process model. The range A corresponds to the case right after the film formation and represents a rage of 440 nm±44 nm (a film thickness fluctuation width of 88 nm), the range B corresponds to the case after the first dry etching and represents a rage of 400 nm±50 nm (a film thickness fluctuation width of 100 nm), and the range C corresponds to the case after the second dry etching and represents a rage of 280 nm±68 nm (a film thickness fluctuation width of 136 nm). Next, comparison was made the influence given to the fluctuation width of the chromaticity by each of the ranges A to C. In this comparison, the chromaticity y which had a specifically large fluctuation width was made a comparison target.

TABLE 1

| Layer | | Refraction index | Film thickness | Remarks |
|---|---|---|---|---|
| | Air | | | |
| 1 | Glass substrate | 1.55 | 5 mm | |
| 2 | BK7 | 1.52 | 50 nm | *1 |
| 3 | SiNx | 1.86 | 50 nm | Undercoat film |
| 4 | $SiO_2$ | 1.5 | 100 nm | Undercoat film |
| 5 | $SiO_2$ | 1.5 | 120 nm | Gate insulating film |
| 6 | $SiO_2$ | 1.5 | 160 nm to 640 nm | First interlayer insulating film |
| 7 | SiNx | 1.86 | 400 nm | Second interlayer insulating film |
| 8 | Organic film | 1.5 | 1000 nm | |
| 9 | ITO | 2 | 40 nm | |
| | Air | | | |

*1: Inserted for correcting the absorption coefficient of the substrate

First, in the range A immediately after the film formation of the first interlayer insulating film, the chromaticity x has changed in a range of 0.32 to 0.33, and the chromaticity y has changed in a range of 0.30 to 0.37. At this time, the range of fluctuation of the chromaticity y was 0.07.

Next, in the range B after the first dry etching, the chromaticity x has changed in a range of 0.32 to 0.33, and the chromaticity y has changed in a range of 0.30 to 0.35. At this time, the range of fluctuation of the chromaticity y was 0.05. In the range B, as compared with Range A, in spite of the enlargement of the film thickness fluctuation width, the fluctuation width of the chromaticity y has reduced.

The reason is considered that, in contrast to the range A which corresponded to a section in which the chromaticity y has changed from the maximum value to the minimum value, the range B was a section which had the minimum value of the chromaticity y at its almost central portion. In this way, depending on the thickness of the first interlayer insulating film, the fluctuation width of the chromaticity y can be made small. This was because the film thickness fluctuation width was as small as about ⅔ of a fluctuation period of 160 nm of the chromaticity y.

On the other hand, in the range C after the second dry etching, the chromaticity x has changed in a rage of 0.30 to 0.33, and the chromaticity y has changed in a rage of 0.30 to 0.37. At this time, the fluctuation width of the chromaticity y was 0.07. This range C was a section in which the chromaticity y has changed from the maximum value to the minimum value. Further, since the film thickness fluctuation width expanded to about ¾ of a fluctuation period of 160 nm of the chromaticity y, even if the first interlayer insulating film was formed with any size of the film thickness, the range C might be made to become a section in which the chromaticity y might change almost from the maximum value to the minimum value. Therefore, it is difficult to suppress the fluctuation width of the chromaticity y to be small.

As mentioned above, in accordance with the respective structures and manufacturing methods of JP-A Nos. H07-253593, H09-230373 and 2002-111001, if the second dry etching is performed not only for non-transmissive regions, but also for the almost entire region of the transmissive regions, excavation into the undercoat insulating film increases, and the thickness of the undercoat insulating film becomes thinner. Further, dispersion in film thickness is made to expand. Accordingly, the display quality of a display apparatus, in particular, the chromaticity at the time of displaying white is made to change. Further, depending on a position in a display area, or a position in a substrate, a difference is caused on its level.

In addition to that, if taking a micro loading effect into consideration, an amount of excavation into the undercoat insulating film of transmissive regions tends to increase more. That is based on the following reasons. Generally, as compared with the transmissive region, in the non-transmissive regions, since the patterns, such as wiring, are dense, the opening portion of the resist is small as compared with the transmissive regions. Accordingly, due to a micro loading effect, as compared with the transmissive regions, in the non-transmissive regions, an etching rate tends to lower. Therefore, if the etching time is set up in conformity to the non-transmissive regions, the undercoat insulating film of the transmissive regions is etched more, and an amount of excavation tends to increase more.

Then, in order to control the chromaticity of a display apparatus, it is necessary to control precisely the thickness of an undercoat insulating film of transmissive regions. However, dispersion necessarily exists in film formation facilities and dry etching facilities and such dispersion becomes a factor of fluctuation. Therefore, a structure and a manufacturing method configured to reduce the factor of fluctuation as small as possible are required.

The second problem is a point that, in each of JP-A Nos. H07-253593, H09-230373 and 2002-111001, since the photolithography process and etching process are executed multiple times for the outside of the TFT and are executed only one time for the TFT, there is no effect for a short circuit between the source and drain electrodes of the TFT. Further, as the countermeasure for the above point, if a pattern to separate between the source and drain of the TFT is simply added at the second photolithography process, a LDD resistance changes in a TFT having a LDD (Lightly Doped Drain) structure, and it becomes a factor to change the TFT characteristic. The reason is that if an insulating film on an LDD portion is etched two times or more by dry etching, since the film thickness and surface state of the insulating film change, the fixed electric charge and trap level in the insulating film on the LDD portion are made to change, and then, an effective LDD layer resistance is made to change. If the LDD layer resistance changes, since an ON current and OFF current of the TFT change, the display quality of a panel is influenced greatly.

FIG. 2A illustrates the TFT characteristic in the case where the second photolithography and dry etching to separate source and drain electrodes were executed in a TFT having a LDD structure in a P-channel, and FIG. 2B illustrates the TFT characteristic in the case where the second photolithography and dry etching were not executed. In the characteristic in FIGS. 2A and 2B, a leak current between source and drain was measured by replacing the source and drain electrodes while irradiating light on a backlight. In FIGS. 2A and 2B, the gate voltage is given as Vg=8V. As illustrated in FIGS. 2A and 2B, it turns out that if the second photolithography and dry etching to separate the source and drain electrodes are executed on the LDD, the symmetric property of the leak current changes. This causes display abnormalities, such as crosstalk and flicker, in the display of a panel.

In addition to the above two points, there exists a point to be worried. That is a point that if etching is performed two times or more for a conductive film by dry etching in order to prevent defects due to a short circuit between the same layers of the conductive film, an amount of excavation into a undercoat insulating film increases, and a difference in level in combination of an amount of excavation into a undercoat insulating film and the thickness of the conductive film is made to increase. In the case where an insulating film is further formed on the conducting film, this affects the coatability of them. That is, in the case of a PECVD (Plasma Enhanced Chemical Vapor Deposition) film, due to the deterioration of coverage is, and in the case of a coating film, due to the abnormalities of fluidity in the difference in level at the time of coating and spreading by a spin coater etc., streak-like coating unevenness, so-called striation may be caused. In this connection, the larger difference in level tends to cause the deterioration of striation. The deterioration of coverage may cause the deterioration of the yield and reliability of a display apparatus, and the deterioration of striation may cause deterioration of display qualities, such as display unevenness. The present invention seeks to solve the problem.

SUMMARY

In view of the above problems, there are provided illustrative display apparatuses and illustrative manufacturing methods of the same as embodiment of the present invention.

A display apparatus illustrating one aspect of the present invention is a display apparatus comprising: a counter substrate including a light shielding layer defining transmissive regions where light passes through and non-transmissive regions where light does not pass through; and an active matrix substrate including a pixel area where pixels are arranged in matrix. Each of the pixels includes transmissive region and the non-transmissive region both defined by the light shielding layer. The active matrix substrate includes, in the non-transmissive region of each of the pixels, the transparent substrate, a polycrystalline silicon film formed on the transparent substrate, and the polycrystalline silicon film including a channel portion, a LDD portion, and source and drain portions. The active matrix substrate further includes, in the non-transmissive region of each of the pixels, a gate insulating film formed on the polycrystalline silicon film, a gate electrode formed on the gate insulating film and covering the channel portion, an interlayer insulating film formed on the gate electrode, and a drain layer formed on the interlayer insulating film and including patterned conductive films at least partially covering the source and drain portions respectively. The active matrix substrate includes, in the transparent region of each of the pixels, the transparent substrate, and the gate insulating film and the interlayer insulating film both formed on the transparent substrate. The interlayer insulating film includes zones where the interlayer insulating film is thinner than a part of the interlayer insulating film at a middle of each of the transmissive regions, where each of the zones is located so as to extend between the patterned conductive films neighboring to each other, and the zones are further located so as not to overlap with the transmissive regions and regions laid over the LDD portions.

In the above-described display apparatus, the drain layer may include a patterned island and a wire for transmitting signals to the pixels as the patterned conductive films, where the patterned island and the wire at least partially cover the source and drain portions respectively. Further, the zones of the interlayer insulating film may be located so as to extend between the patterned island and the wire neighboring to each other and to be put at one side or both sides of each of the wires, and the zones are further located so as not to overlap with the transmissive regions and regions laid over the LDD portions.

A display apparatus illustrating another aspect of the present invention is a display apparatus comprising: a counter substrate including a light shielding layer defining transmissive regions where light passes through and non-transmissive regions where light does not pass through; and an active matrix substrate including a pixel area where pixels are arranged in matrix. Each of the pixels includes the transmissive region and the non-transmissive region both defined by the light shielding layer. The active matrix substrate includes, in the non-transmissive region of each of the pixels, a transparent substrate, and a polycrystalline silicon film formed on the transparent substrate, the polycrystalline silicon film including a channel portion, a LDD portion, and source and drain portions. The active matrix substrate further includes, in the non-transmissive region of each of the pixels, a gate insulating film formed on the polycrystalline silicon film, a gate electrode formed on the gate insulating film and covering the channel portion, an interlayer insulating film formed on the gate electrode, and a drain layer formed on the interlayer insulating film and including patterned conductive films at least partially covering the source and drain portions respectively. The active matrix substrate includes, in the transparent region of each of the pixels, the transparent substrate, and the gate insulating film and the interlayer insulating film both formed on the transparent substrate. The interlayer insulating film includes zones where the interlayer insulating film is thinner than a part of the interlayer insulating film at a middle of each of the transmissive regions, where the zones are located in a first area and a second area. The first area is located so as to extend between the patterned conductive films neighboring to each other and not to overlap with regions laid over the LDD portions. The second area is peripheries of the transmissive regions. Each of the zones in the second area is equal or less in width than the each of the zones in the first area.

A manufacturing method of a display apparatus illustrating one aspect of the present invention is a manufacturing method of a display apparatus. The display apparatus comprises a counter substrate including a light shielding layer defining transmissive regions where light passes through and non-transmissive regions where light does not pass through; and an active matrix substrate including a pixel area where pixels are arranged in matrix, where each of the pixels includes the transmissive region and the non-transmissive region both defined by the light shielding layer. The manufacturing method comprises: forming source and drain portions by forming on the transparent substrate islands out of a polycrystalline silicon film and doping impurities to both outsides of a portion to be a channel portion, in each of the islands; forming a gate insulating film on the polycrystalline silicon film; forming gate electrodes on the gate insulating film; forming LDD portions located between the neighboring source and drain portions by doping impurities into the islands by using the gate electrodes as masks; forming interlayer insulating films on the gate electrodes; and forming a conductive film as a drain layer on the interlayer insulating films. The manufacturing method further comprises: forming the transmissive regions by performing dry etching by using a first resist pattern for separating the conductive film, to form patterned conductive films, where the transmissive regions excludes the polycrystalline silicon film, the gate electrodes and the patterned conductive films when being viewed in a normal direction of the transparent substrate. The manufacturing method further comprises: performing dry etching by using a second resist pattern for separating again the conductive film in an area between the patterned conductive films, where the second resist pattern includes openings not overlapping with the transmissive regions and with regions laid over the LDD portions.

In the above-described manufacturing method, the forming the transmissive regions, may include forming the transmissive regions by performing the dry etching by using the first resist pattern for separating the conductive film, to form patterned islands and wires for transmitting signals to the pixels, as the patterned conductive films, where the transmissive regions excludes the polycrystalline silicon film, the gate electrodes, and the patterned islands and the wires of the drain layer when being viewed in a normal direction of the transparent substrate. Further, the performing the dry etching by using the second resist pattern, may include performing the dry etching by using the second resist pattern for separating again the conductive film in an area between the patterned island and the wire neighboring to each other and in areas at one side or both sides of the each of the wires, where the second resist pattern includes openings not overlapping with the transmissive regions and with regions laid over the LDD portions.

A manufacturing method of a display apparatus illustrating another aspect of the present invention is a manufacturing method of a display apparatus. The display apparatus comprising: a counter substrate including a light shielding layer defining transmissive regions where light passes through and non-transmissive regions where light does not pass through; and an active matrix substrate including a pixel area where pixels are arranged in matrix, where each of the pixels includes the transmissive region and the non-transmissive region both defined by the light shielding layer. The manufacturing method comprises: forming source and drain portions by forming on the transparent substrate islands out of a polycrystalline silicon film and doping impurities to both outsides of a portion to be a channel portion in each of the islands; forming a gate insulating film on the polycrystalline silicon film; forming gate electrodes on the gate insulating film; forming LDD portions located between the neighboring source and drain portions by doping impurities into the islands by using the gate electrodes as masks; forming interlayer insulating films on the gate electrodes; and forming a conductive film as a drain layer on the interlayer insulating films. The manufacturing method further comprises: forming the transmissive regions by performing dry etching by using a first resist pattern for separating the conductive film, to form patterned conductive films, where the transmissive regions excludes the polycrystalline silicon film, the gate electrodes and the patterned conductive films when being viewed in a normal direction of the transparent substrate. The manufacturing method further comprises: performing dry etching by using a second resist pattern and a third resist pattern, the second resist pattern being a resist pattern for separating again the conductive film in an area between the patterned conductive films, where the second resist pattern includes openings not overlapping with regions laid over the LDD portions, and the third resist pattern is a resist pattern for separating again the conductive film in peripheries of the transmissive regions, with a separation width being equal or less than a separation width of the second resist pattern.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which:

FIG. 1 is a diagram illustrating a structure used for an optical simulation;

DETAILED DESCRIPTION

In view of the above-mentioned problems, there are provided illustrative display apparatuses and illustrative manufacturing methods of the display apparatus as embodiments of the present invention, for preventing a short circuit between pattered structures of a conductive film so as to increase the yield, and simultaneously, suppressing a change of display qualities and a change of reliabilities due to a change of coatabilities of a film on a conductive film to the minimum while preventing a change of the chromaticity due to a change of the thickness of an insulating film in transmissive regions and the deterioration of display qualities due to a change of the TFT characteristics.

An illustrative display apparatus as a first embodiment is a display apparatus comprising: a counter substrate including a light shielding layer defining transmissive regions where light passes through and non-transmissive regions where light does not pass through; and an active matrix substrate including a pixel area where pixels are arranged in matrix. Each of the pixels includes the transmissive region and the non-transmissive region both defined by the light shielding layer. The active matrix substrate includes, in the non-transmissive region of each of the pixels, a transparent substrate, a polycrystalline silicon film formed on the transparent substrate, the polycrystalline silicon film including a channel portion, a LDD portion, and source and drain portions. The active matrix substrate further includes, in the non-transmissive region of each of the pixels, a gate insulating film formed on the polycrystalline silicon film, a gate electrode formed on the gate insulating film and covering the channel portion, an interlayer insulating film formed on the gate electrode, and a drain layer formed on the interlayer insulating film and including patterned conductive films at least partially covering the source and drain portions respectively. The active matrix substrate includes, in the transparent region of each of the pixels, the transparent substrate, and the gate insulating film and the interlayer insulating film both formed on the transparent substrate. The interlayer insulating film includes zones where the interlayer insulating film is thinner than a part of the interlayer insulating film at a middle of each of the transmissive regions, where the zones each is located so as to extend between the patterned conductive films neighboring to each other, and the zones is further located so as not to overlap with the transmissive regions and regions laid over the LDD portions (see FIGS. 4A, 4B and 5).

Figure 4A:
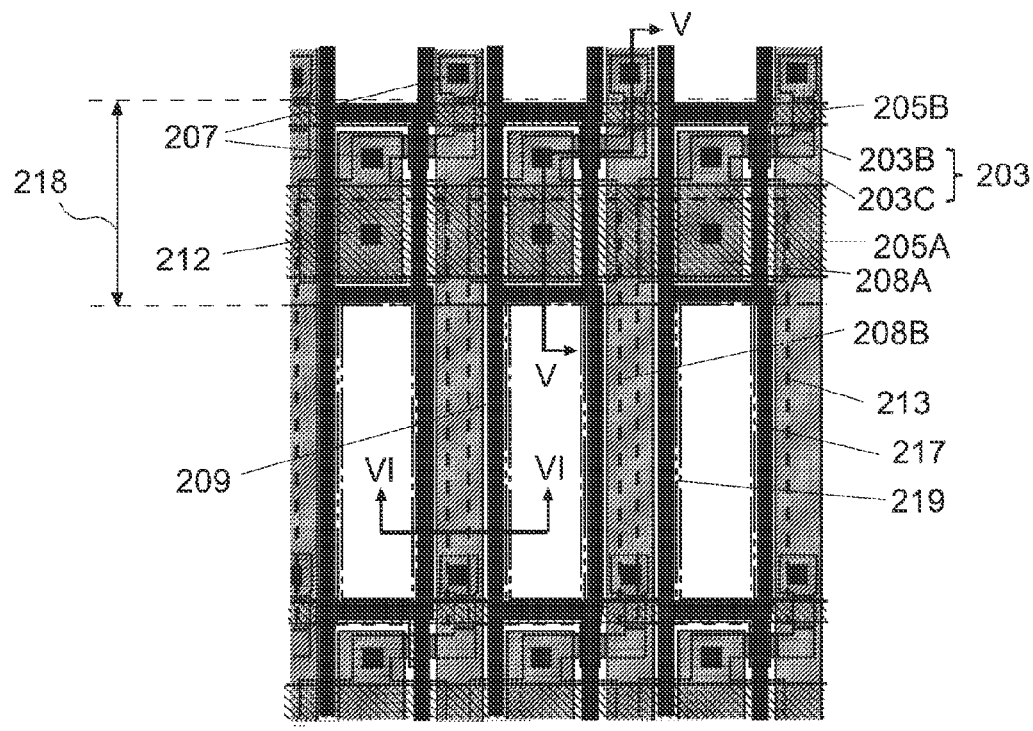
FIG. 4A is an approximately plan view of a pixel area of the display apparatus in the first embodiment of the present invention.
Figure 4B:
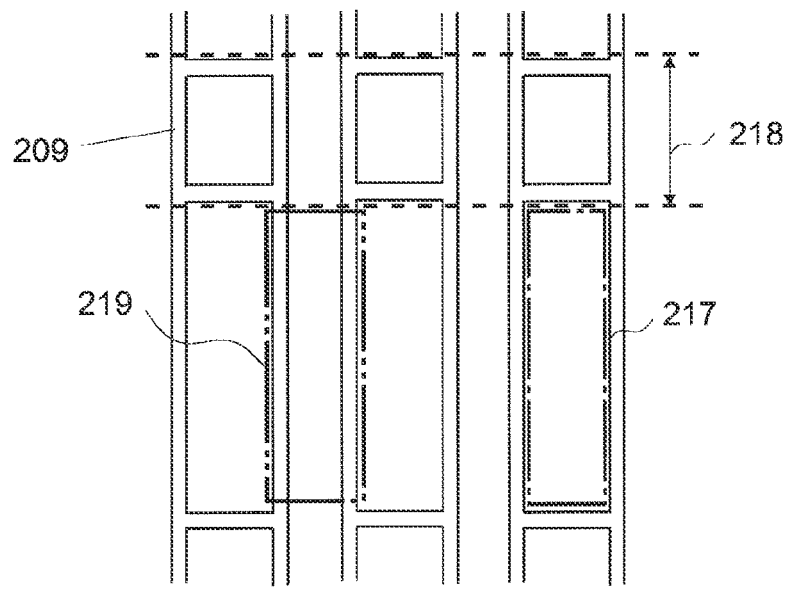
FIG. 4B is a schematic diagram of a pixel area of the display apparatus in the first embodiment of the present invention.
Figure 6:
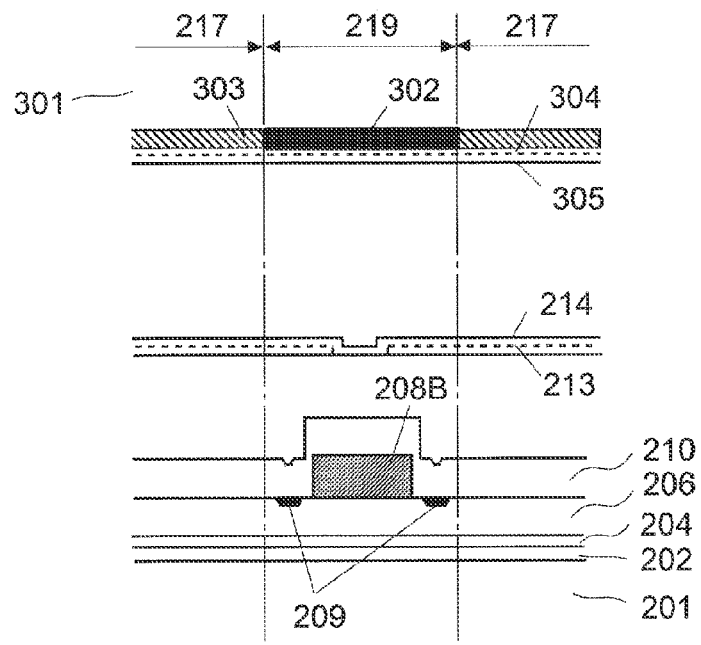
FIG. 6 is an approximately cross sectional view (taken along the VI-VI line in FIG. 4A) of a pixel area of the display apparatus in the first embodiment of the present invention.

Further, the zones are located so as to be put at both sides of each of wires, which are formed in the drain layer as the patterned conductive films, for transmitting signals to the pixels (see FIGS. 4A, 4B and 6).

In this embodiment, in each area between the patterned structures of the conductive film (patterned conductive films) in the non-transmittive regions, photolithography and dry etching are executed two times for the drain layer, and a difference in level is formed on the surface of the interlayer insulating film, to form a zone where the interlayer insulating film is thinner than a part of the interlayer insulating film at a middle of the transmissive region. This configuration can prevent occurrence of point defects and lines defects due to a short circuit between patterned conductive films in the drain layer and can increase the yield. Further, also at the both sides of each wire formed of a patterned conductive film, the difference in level is formed on the interlayer insulating film to form a zone where the interlayer insulating film is thinner than a part of the interlayer insulating film at a middle of the transmissive region. This configuration can effectively prevent occurrence of point defects and lines defects due to a short circuit between patterned conductive films in the drain layer. In the transmissive regions, the second dry etching is not executed for the drain layer, which does not increase the amount of excavation into an interlayer insulating film in the transmissive region and does not make the interlayer insulating film thinner than that after the first dry etching has been executed. Therefore, such the embodiment can prevent a change of the chromaticity of the display apparatus, especially, a change of the chromaticity when white is displayed on the display apparatus. Further, the dry etching is executed on the polycrystalline silicon film so as to avoid the region laid over the LDD portions, which prevent an effective change of the resistance of the LDD layer and a change of the TFT characteristics coming from the change of the resistance. Therefore, a change of the display quality of the panel of the display apparatus can be prevented.

Figure 9:
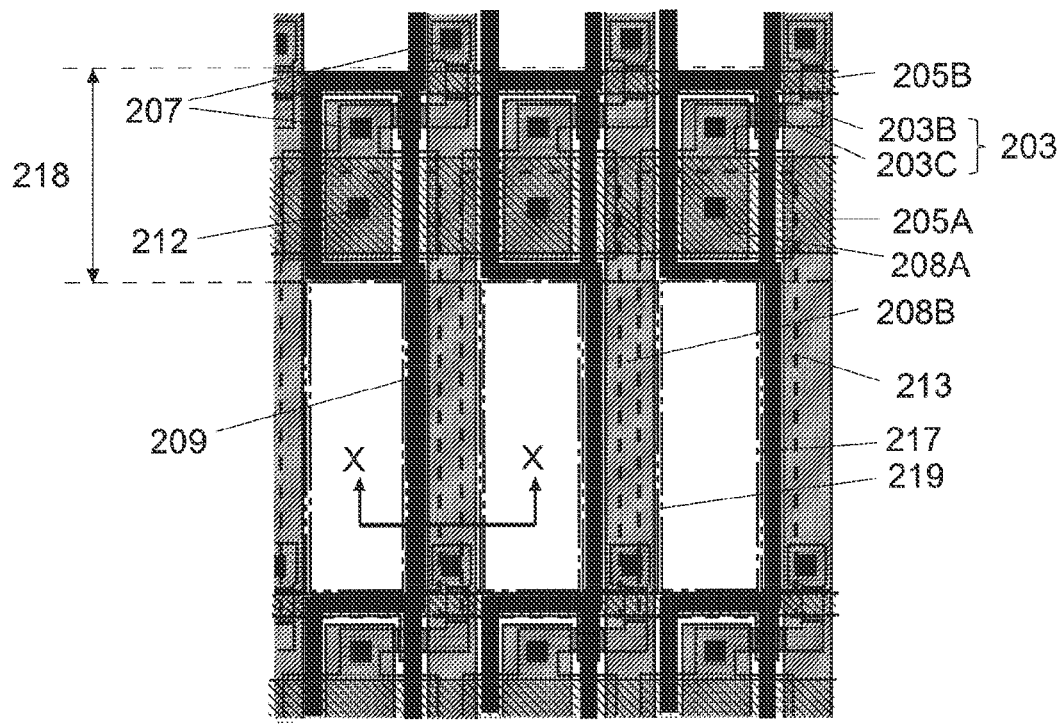
FIG. 9 is an approximately plan view of a pixel area of a display apparatus in the second embodiment of the present invention.
Figure 10:
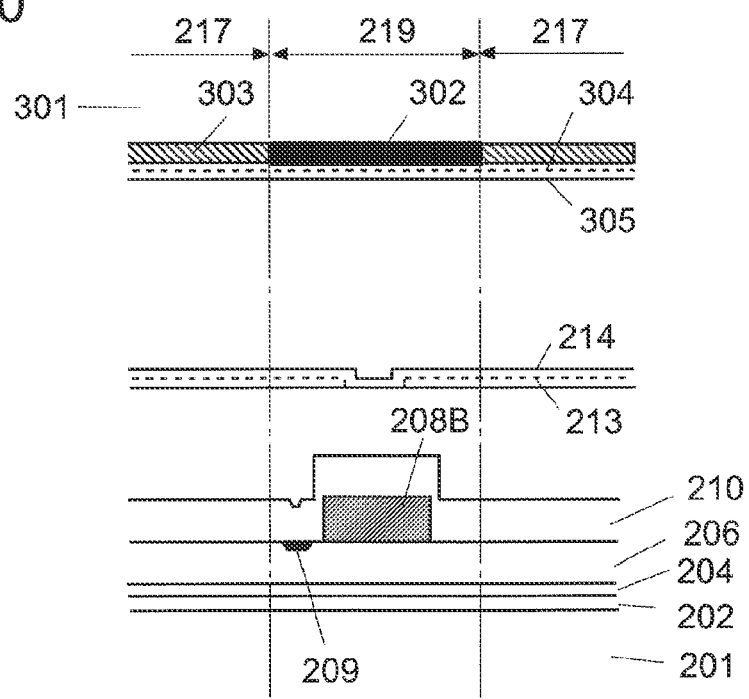
FIG. 10 is an approximately cross sectional view (taken along the X-X line in FIG. 9) of the pixel area of the display apparatus in the second embodiment of the present invention.

An illustrative display apparatus as a second embodiment of the present invention has the following construction which is different from that of the first embodiment: the zones are located so as to be put at only one side of each of wires, which are formed in the drain layer as the patterned conductive films, for transmitting signals to the pixels (see in FIGS. 9 and 10).

In this embodiment, the degree to prevent occurrence of point defects and lines defects due to a short circuit between patterned conductive films in the drain layer, is slightly reduced in comparison with the first embodiment, but the wider area of transmissive regions can be secured. Therefore, the transmittance of the display apparatus can be enhanced.

Also in this embodiment, in the transmissive regions, the second dry etching is not executed for the drain layer similarly to the first embodiment, which does not increase the amount of excavation into an interlayer insulating film in the transmissive region and does not make the interlayer insulating film thinner than that after the first dry etching has been executed. Therefore, such the embodiment can prevent a change of the chromaticity of the display apparatus, especially, a change of the chromaticity when white is displayed on the display apparatus.

Figure 12:
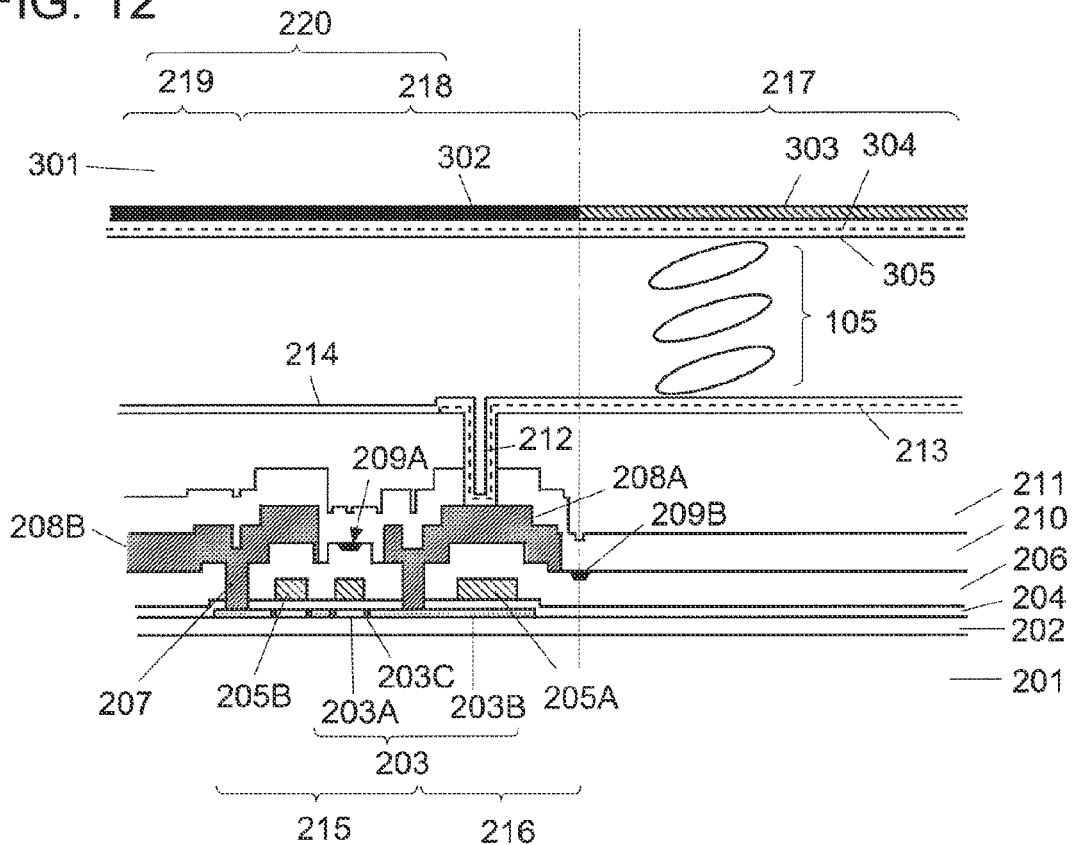
FIG. 12 is an approximately cross sectional view (taken along the XII-XII line in FIG. 11) of the pixel area of the display apparatus in the third embodiment of the present invention.
Figure 13:
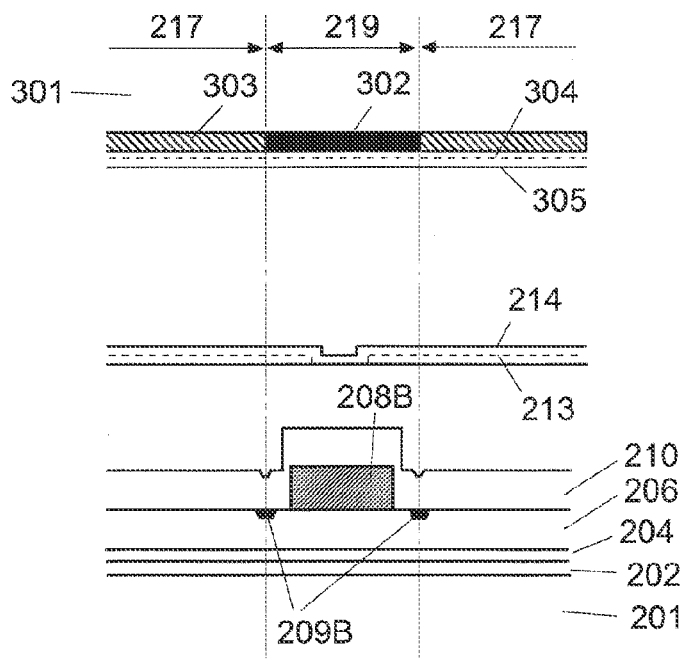
FIG. 13 is an approximately cross sectional view (taken along the XIII-XIII line in FIG. 11) of the pixel area of the display apparatus in the third embodiment of the present invention.

An illustrative display apparatus as a third embodiment is a display apparatus comprising: a counter substrate including a light shielding layer defining transmissive regions where light passes through and non-transmissive regions where light does not pass through; and an active matrix substrate including a transparent substrate and a pixel area where pixels are arranged in matrix. Each of the pixels includes the transmissive region and the non-transmissive region both defined by the light shielding layer. The active matrix substrate includes, in the non-transmissive region of each of the pixels, the transparent substrate, and a polycrystalline silicon film formed on the transparent substrate, the polycrystalline silicon film including a channel portion, a LDD portion, and source and drain portions. The active matrix substrate further includes, in the non-transmissive region of each of the pixels, a gate insulating film formed on the polycrystalline silicon film, a gate electrode formed on the gate insulating film and covering the channel portion, an interlayer insulating film formed on the gate electrode, and a drain layer formed on the interlayer insulating film and including patterned conductive films at least partially covering the source and drain portions respectively. The active matrix substrate includes, in the transparent region of each of the pixels, the transparent substrate, and the gate insulating film and the interlayer insulating film both formed on the transparent substrate. The interlayer insulating film includes zones where the interlayer insulating film is thinner than a part of the interlayer insulating film at a middle of each of the transmissive regions. The zones are located in a first area and a second area, where the first area is located so as to pass through between the patterned conductive films in the drain layer and not to overlap with regions laid over the LDD portions, and the second area is the peripheries of the transmissive regions. Each of the zones in the second area is equal or less in width than the each of the zones in the first area (see FIGS. 11, 12 and 13).

In this embodiment, in each area between the patterned conductive films in the non-transmissive regions, photolithography and dry etching are executed two times for the drain layer, and a difference in level is formed on the surface of the interlayer insulating film, to form a zone where the interlayer insulating film is thinner than a part of the interlayer insulating film at a middle of the transmissive region. This configuration can prevent occurrence of point defects and lines defects due to a short circuit between patterned conductive films in the drain layer and can increase the yield. In the transmissive regions, the regions where photolithography and dry etching are executed two times are formed in the peripheries of the transmissive regions to have the width equal to or less than that of regions where photolithography and dry etching are executed two times in the non-transmissive regions, so as to be minimized in width. This construction can increase the amount of excavation into the interlayer insulating film around the peripheries of the transmissive regions, however, does not increase the amount of excavation into the interlayer insulating film at the middle portion of each transmissive region and does not make the interlayer insulating film thinner than that after the first dry etching has been executed. Further, in this construction, thickness dispersion of the interlayer insulating films at the middle portion of each transmissive region does not increase. Therefore, such the embodiment can prevent a change of the chromaticity of the display apparatus, especially, a change of the chromaticity when white is displayed on the display apparatus. Further, the larger area of the transmissive regions can be secured in comparison with that in the second embodiment, which enhances the transmittance of the display apparatus.

Further, in both of the second and third embodiments, in the regions between patterned conductive films of the drain layer in the non-transmissive regions, zones where the interlayer insulating film is thinner than a part of the interlayer insulating film at a middle of each of the transmissive regions are formed in the regions laid over the polycrystalline silicon film excluding LDD portions of TFTs. Thereby, the fixed electric charge in the insulating films laid over the LDD portions changes so as to prevent an effective LDD layer resistance from being changed. Therefore, a change in display quality of the panel of the display apparatus can be restricted (illustrated in FIGS. 9 and 11).

In either of the embodiments, in areas between the patterned conductive films of the drain layer in the non-transmissive regions, by making the width of zones where photolithography and dry etching are executed two times for the drain layer to be 0.1 μm or more, the area where a short circuit has been caused in the first dry etching process can be surely separated (see FIGS. 4A, 4B, 9 and 11).

In either of the embodiments, in areas between the patterned conductive films of the drain layer in the non-transmissive regions, the width of zones where photolithography and dry etching are executed two times for the drain layer is made to be less than the distance of the patterned conductive films separately formed in the drain layer, and the each zone includes a difference in level at the boundary thereof so as to form a tapered shape with a forward taper angle less than 90 degrees. Thereby, the cross section of the drain layer can be formed in a stepped shape substantially, which can minimize an influence on display quality and reliability of the display apparatus coming from a change in the coatability of films formed on the drain layer (see FIGS. 4A, 4B, 9 and 11).

In either of the embodiments, the zones where the interlayer insulating film is thinner than a part of the interlayer insulating film at a middle of each of the transmissive regions, are formed by using a pattern having the same width (in other words, each of the zones has a same width over the non-transmissive regions). With this, by minimizing dispersion due to the micro loading effect, it becomes possible to control the excavating into the interlayer insulating films, and to control an influence on display quality and reliability of the display apparatus coming from a change in the coatability of films formed on the drain layer, to be minimized (see FIGS. 4A, 4B, 9 and 11).

In either of the embodiments, each of the zones where the interlayer insulating film is thinner than a part of the interlayer insulating film at a middle of each of the transmissive regions, is formed of a groove which is not closed in the vicinity of the patterned conductive films or the wires of the drain layer, or is formed of a groove continuing between the opposite ends of the pixel area, in the vicinity of the patterned conductive films or the wires of the drain layer. This configuration can prevent occurrence of point defects and lines defects due to a short circuit between patterned conductive films in the drain layer (see FIGS. 4A, 4B, 9 and 11).

In either of the embodiments, each of the zones where the interlayer insulating film is thinner than a part of the interlayer insulating film at a middle of each of the transmissive regions, has at the boundary thereof a difference in level, being 170 nm or more. This configuration can prevent occurrence of point defects and lines defects due to a short circuit between patterned conductive films in the drain layer and can increase the yield (see FIGS. 5, 6, 10, 12 and 13).

According to the illustrative embodiments, it becomes possible to prevent occurrence of point defects and lines defects due to a short circuit between patterned conductive films so as to increase the yield, while preventing a change of the chromaticity due to a change of the thickness of an insulating film in transmissive regions of a display apparatus and a change of display qualities due to a change of the TFT characteristics. Simultaneously, it becomes possible to suppress influence to display qualities and reliabilities to the minimum due to a change of coatabilities of a film on a conductive film.

Illustrative embodiments of the present invention will be described in detail with reference to drawings.

Embodiment 1

Figure 2A:
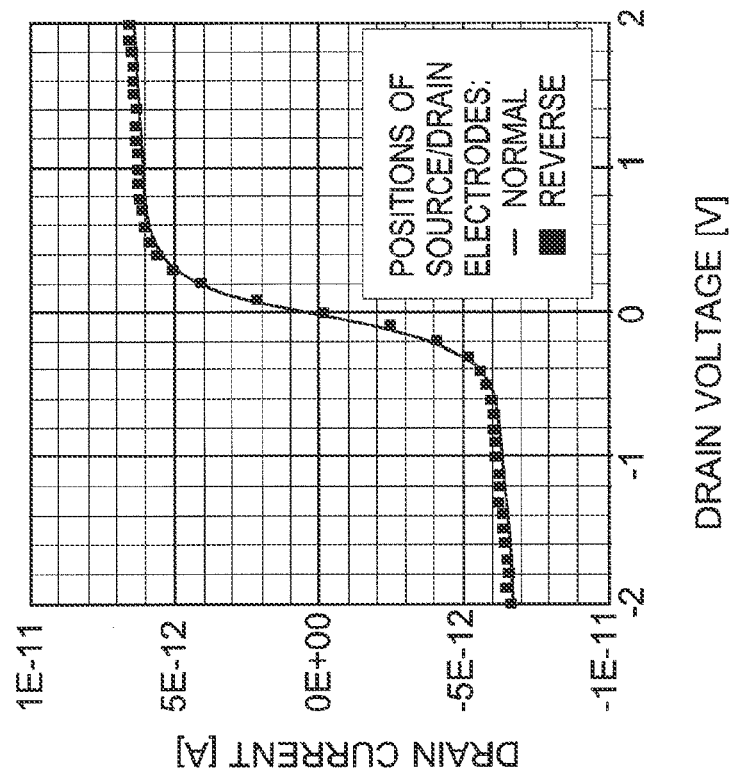
FIGS. 2A and 2B are diagrams illustrating the characteristic of a TFT for having been subjected to the second photolithography and dry etching and the characteristic of a TFT for having been not subjected to them.
Figure 2B:
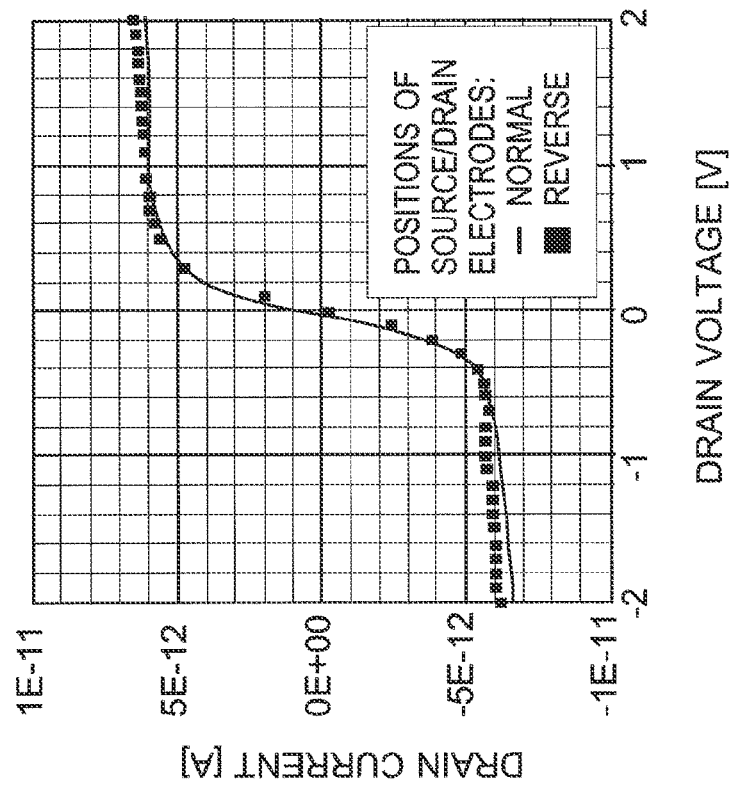
Figure 3:
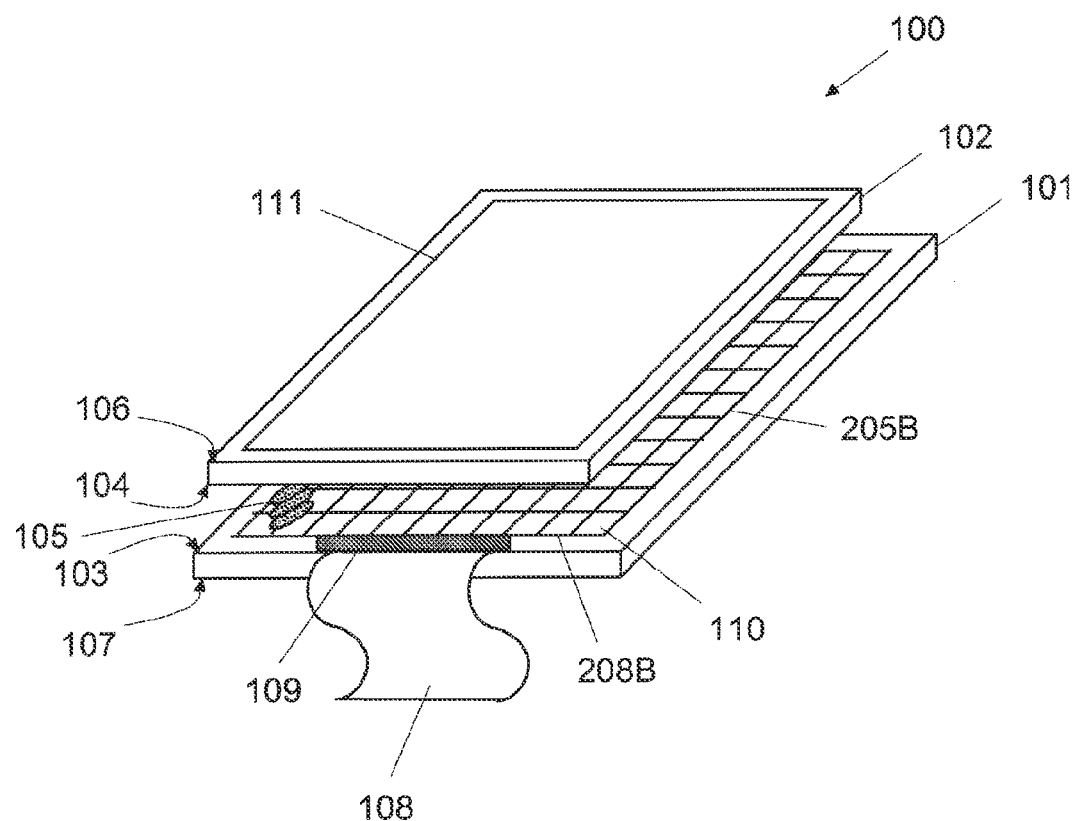
FIG. 3 is a schematic illustration of a display apparatus in the first embodiment of the present invention.

A display apparatus 100 according to the first embodiment of the present invention is described by using FIG. 3. The display apparatus 100 is a transmissive active matrix liquid crystal display apparatus, and is constituted by a TFT substrate (active matrix substrate) 101, a counter substrate 102, and a liquid crystal 105 sandwiched across orienting films 103 and 104 between the both substrates. Further, the display apparatus 100 is constituted such that polarizing plates 106 and 107 are pasted separately on the respective surfaces of the TFT substrate 101 and the counter substrate 102, which are the surfaces opposite to the surfaces coming in contact with the liquid crystal 105. Furthermore, the display apparatus 100 includes a FPC (Flexible Printed Circuit) 108 used to input electrical signals from the outside and a COG (Chip On Glass) 109 used to develop the input electrical signals into a display area. Moreover, the display apparatus 100 includes a display area 111 configured to display picture images based on electrical signals by transmitting light with pixels 110 arranged in a matrix-like arrangement.

On the TFT substrate side of the display area 111, gate wires 205B and drain wires 208B arranged in a direction perpendicular to the gate wires 205B are formed. At each of intersection points between the gate wires 205B and the drain wires 208B, a TFT 215 (illustrated in FIG. 5) configured to serve as a switching element, a storage capacitance 216 (illustrated in FIG. 5) configured to retain a voltage written in from the drain wire 208B through the TFT 215, and a pixel electrode 213 (illustrated in FIG. 5) configured to give a voltage to a liquid crystal are formed so as to constitute a pixel 110.

Figure 5:
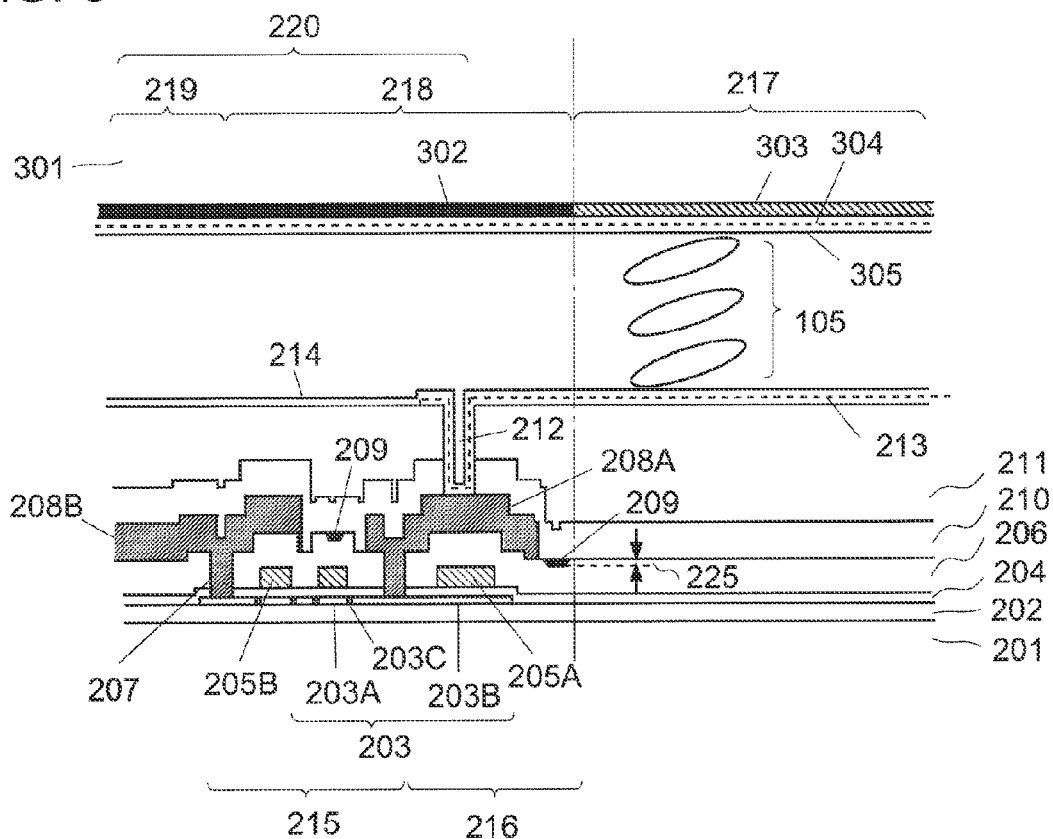
FIG. 5 is an approximately cross sectional view (taken along the V-V line in FIG. 4A) of a pixel area of the display apparatus in the first embodiment of the present invention.

Next, the constitution of a pixel is described in detail. Each of FIGS. 4A and 4B is a plan view of a unit pixel in this embodiment, where FIG. 4A is an approximately plan view, and FIG. 4B is a schematic diagram. FIG. 5 is a cross sectional view taken along the V-V line in a pixel of FIG. 4A, and FIG. 6 is a cross sectional view taken along the VI-VI line in a pixel of FIG. 4A. The inner portion of a unit pixel is constituted by a transmissive region 217 (a region enclosed with a one-dot chain line in FIG. 4A and the detail is illustrated in FIG. 4B)

in which only transparent films are laminated and light passes through, and a non-transmissive region 220 in which a TFT serving as a switching element, a storage capacitance portion, wires and the like are formed, and light does not pass through. The non-transmissive region is further constituted with a storage capacitance section 218 (a region enclosed with broken line in FIG. 4A, and the detail is illustrated in FIG. 4B) and a wiring section 219 (a region enclosed with a two-dot chain line in FIG. 4A, and the detail is illustrated in FIG. 4B). Further, the above unit pixels are arranged in matrix, thereby forming a pixel area.

In the TFT substrate 101, on the glass substrate 201, an undercoat film 202 composed of a material such as a silicon oxide film ($SiO_2$ film), a silicon nitride film (SiNx film), and the like is formed, and further, thereon, islands made out of a polycrystalline silicon film 203 are formed. On each of the islands composed of a polycrystalline silicon film 203, source and drain portions 203B made to a low resistance by being doped at a high concentration with impurities such as boron, LDD portions 203C doped at an intermediate concentration and disposed between the source and drain portions 203B, and channel portions 203A not doped or doped at a very low concentration and disposed between the LDD portions 203C are formed.

On the polycrystalline silicon film 203, a gate insulating film 204 composed of a silicon oxide film ($SiO_2$ film) is formed, and further, thereon, a gate wire 205B (including a gate electrode) and a gate capacitance line 205A each constituted with a metal film composed of a single layer made of any one of molybdenum (Mo), tantalum (Ta), niobium (Nb), chromium (Cr), tungsten (W), and aluminum (Al), a laminated layer of the those materials, or an alloy film of the those materials are formed.

On the gate capacitance line 205A and the gate wire 205B, a first interlayer insulating film 206 composed of a material such as a silicon oxide film ($SiO_2$ film), a silicon nitride film (SiNx film), and the like is formed. In the first interlayer insulating film 206, first contact holes 207 used to take electric contact with the source and drain portions 203B and a gate layer are formed.

On the first interlayer insulating film 206 and in the first contact holes 207, a patterned conductive film (a drain wire 208B and storage capacitance drain layer portion 208A) constituted with a metal film composed of a single layer made of molybdenum (Mo), tantalum (Ta), niobium (Nb), chromium (Cr), tungsten (W), and aluminum (Al), a laminated layer of the those materials, or an alloy film of the those materials are formed. In the non-transmissive region 220 in each pixel, there are formed a difference in level (a stepped structure) on the surface of the first interlayer insulating film, extending in an area between the storage capacitance drain layer portion 208A and the drain wire 208B, in an area between the storage capacitance drain layer portion 208A and the transmissive region 217, and in areas at both sides of the drain wire 208B, which provides zones where the first interlayer insulating film 206 is formed to be thinner than itself at the middle of the transmissive region. These zones 209 have been formed by executing photolithography and dry etching two times for the drain wire 208B and the storage capacitance drain layer portion 208A. By forming these zones 209, it becomes possible to prevent a short circuit between the drain wire 208B and the storage capacitance drain layer portion 208A and to prevent a short circuit between the neighboring drain wires 208B.

Further, as illustrated in FIGS. 4A and 5, the zone 209 where the first interlayer insulating film 206 is formed to be thinner than itself at the middle of the transmissive region, is made to avoid to extend above the LDD portion 203C of the TFT, and formed so as to extend over the polycrystalline silicon film 203 on the gate wire 205B (gate electrode) (that is, so as to extend over the channel portion 203A). Therefore, while preventing effectively a short circuit between the drain wire 208B and the storage capacitance drain layer portion 208A, simultaneously, it becomes possible to prevent a change of a fixed electric charge or a trap level in the first interlayer insulating film 206 on the LDD portion 203C. Accordingly, it becomes possible to prevent a change of the TFT characteristic due to a change of an LDD layer resistance.

Furthermore, as illustrated in FIGS. 4A and 4B, on the zone 209 where this first interlayer insulating film is formed to be thinner than itself at the middle of the transmissive region, a groove is formed in a non-closed form in the vicinity of each of the both sides of the drain wire 208B in the wiring section 219, or a groove is formed so as to continue from one end to another end in a unit pixel in the vicinity of each of the both sides of the drain wire 208B, whereby it becomes possible to prevent occurrence of line defects due to a short circuit between the neighboring drain wires 208B.

Moreover, the width of the zone 209 where this first interlayer insulating film is formed to be thinner than itself at the middle of the transmissive region is formed to be a width less than a separated distance between the storage capacitance drain layer portion 208A and the drain wire 208B. Such a groove includes a difference in level so as to form a tapered shape with a forward taper angle less that 90 degrees. With this, the cross section of a drain layer can be made into a substantially step-wise configuration. Accordingly, at the next process, in the case where a film is formed by a PECVD (Plasma Enhanced Chemical Vapor Deposition), a change of coverage can be suppressed to the minimum. Also, at the next process, in the case where a coating layer is formed, the deterioration of striation can be suppressed to the minimum. With this, it becomes possible to prevent a change of the yield and reliability of a display apparatus due to a change of coverage, and a change of display qualities such as display unevenness due to the deterioration of striation.

In addition, the width of the zone 209 where this first interlayer insulating film is formed to be thinner than itself at the middle of the transmissive region is formed with a pattern having a constant width. With this, by minimizing dispersion due to the micro loading effect at the time of forming by dry etching the zones 209 where this first interlayer insulating film is formed to be thinner than itself at the middle of the transmissive region, it becomes possible to control the excavating into the first interlayer insulating film 206, whereby a change of coatability on a stepped structure (the difference in level) at the next process can be suppressed.

As illustrated in FIG. 5, on the surface of the first interlayer insulating film 206, in the zone 209 where this first interlayer insulating film is formed to be thinner than itself at the middle of the transmissive region, by forming a difference in level (a stepped structure) so as to be provided with a forward taper angle less than 90 degrees, a lower portion of a side surface of the storage capacitance drain layer portion 208A facing the transmissive region 217 is shaped so as to swell. Further, similarly in FIG. 6, a lower portion of a side surface of the drain wire 208B facing the transmissive region 217 of is shaped so as to swell. Therefore, an effect equivalent to that in the case where a forward taper angle is provided on a side surface of the storage capacitance drain layer portion 208A positioned to face the transmissive region 217 and on a side surface of the drain wire 208B positioned to face the transmissive region 217, is created. As compared with the case where there is not a difference in level on the surface of the first interlayer insulating film 206, in this case, it becomes possible to rather improve the coverage of the insulating film to be formed at the next process.

Further, as illustrated in FIG. 5, on the surface of the first interlayer insulating film 206, at a boundary of the zone 209 where the first interlayer insulating film is formed to be thinner than itself at the middle of the transmissive region, a difference in level 225 being 170 nm is formed. The reasons are as follows. That is, for a portion which has not been separated at the time of the first dry etching, if the second dry etching is performed for the same time as the first dry etching in order to separate the not-separated portion securely by the second dry etching, a portion having been separated normally by the first dry etching is excavated by the second dry etching. With this, it becomes possible to prevent a short circuit between the drain wire 208B and the storage capacitance drain layer portion 208A and a short circuit between the neighboring drain wires 208B.

Moreover, in the transmissive region 217 in a pixel, there is no zone where the film thickness of the first interlayer insulating film becomes thin as with the non-transmissive region 220. This is because, in the transmissive region 217, the dry etching for the drain wire 208B and the storage capacitance drain layer portion 208A has been performed only one time. Accordingly, the film thickness of the first interlayer insulating film 206 is still in the state after the first dry etching. Therefore, it becomes possible to suppress a change of the display quality of a display apparatus, in particular, a change of chromaticity at the time of displaying white.

Further, on the first interlayer insulating film 206, the storage capacitance drain layer portion 208A, the drain wire 208B, and the zones 209 where this first interlayer insulating film is formed to be thinner than the central portion of the transmissive region, there are formed a second interlayer insulating film 210 composed of a silicon nitride film (SiNx film) etc. and an organic layer 211. In the second interlayer insulating film 210 and the organic layer 211, second contact holes 212 for taking electrical contact with the storage capacitance drain layer portion 208A are formed. On the second interlayer insulating film 210 and in the second contact holes 212, a pixel electrode 213 composed of a transparent conductive film, such as ITO (Indium Tin Oxide), is formed. Furthermore, on these films, an orienting film 214 composed of polyimide etc. is formed.

At the counter substrate 102 side of the display area, on the glass substrate 301, a black matrix (light shielding layer) 302, a color resist layer 303 of each of red, green, and blue (RGB), and a counter electrode 304 for giving a common electric potential to a liquid crystal are formed. Furthermore, on these, an orienting film 214 composed of polyimide etc. is formed. In each pixel, the TFT 215 is made to turn ON with a scanning signal from the gate wire 205B, picture signals are supplied to the pixel electrode 213 from the drain wire 208B through the TFT 215, and an electric field is generated between the pixel electrode 213 and the counter electrode 304 of the counter substrate. With this, the liquid crystal 105 is modulated so as to change optical transmittance.

Pixels 110 are driven so as to transmit light rays of a backlight from the back surface of the TFT substrate 101 toward the back surface side of the counter substrate 102, i.e., the display observation side through the polarizing plate 106 at the TFT substrate side, the liquid crystal layer 105, the color resist layers 303 of the counter substrate, and the polarizing plate 107 at the counter substrate side. By driving the pixels 110 in this way, the picture signals are actually displayed.

Next, manufacturing processes are described by using the drawings for each process. Here, each of FIGS. 7A to 7G corresponds to the plan view of the structures illustrated in FIG. 4A at one of the manufacturing processes, and each of FIGS. 8A to 8H corresponds to the cross sectional view of the structures illustrated in FIG. 5 at one of the manufacturing processes, wherein the cross sectional view is taken along the V-V line in FIG. 4A.

Figure 7A:
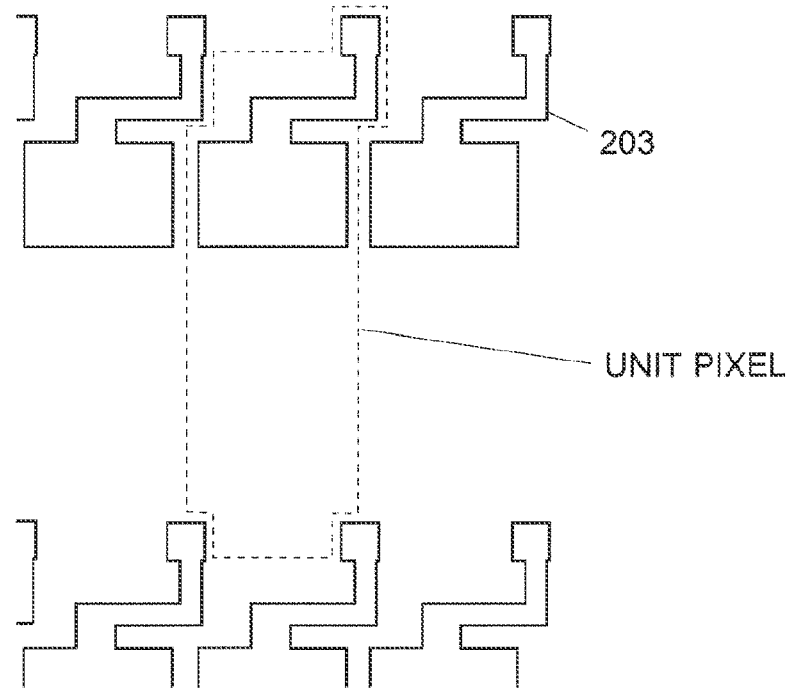
FIG. 7A is an approximately plan view of manufacturing processes of the display apparatus in the first embodiment of the present invention, and illustrates processes up to the process of forming islands composed of polycrystalline silicon.
Figure 8A:
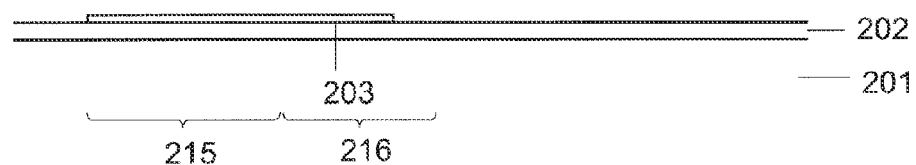
FIG. 8A is an approximately cross sectional view of manufacturing processes of the display apparatus in the first embodiment of the present invention, and illustrates processes up to the process of forming islands composed of polycrystalline silicon.

As illustrated in FIGS. 7A and 8A, on the glass substrate 201, by a PECVD (Plasma Enhanced Chemical Vapor Deposition) method, as an undercoat film 202, a silicon nitride film (50 nm), a silicon oxide film (100 nm), and an amorphous silicon film (50 nm) were laminated, and followed by annealing at 500° C. and dehydrogenation. Thereafter, the above compositions were crystallized by being irradiated with an excimer laser (XeCl), whereby a polycrystalline silicon film 203 was formed. Further, according to a photolithography process, a resist pattern of islands was formed, and then, dry etching was performed along it. Thereafter, via a resist removing process, the islands composed of the polycrystalline silicon film 203 were formed. Here, a broken line in FIG. 7A illustrates a unit pixel.

Figure 7B:
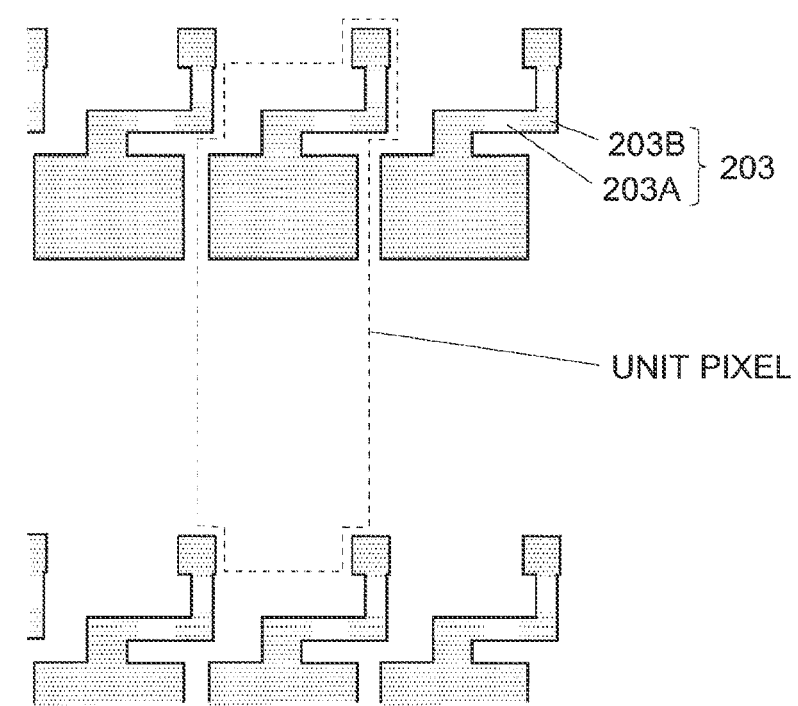
FIG. 7B is an approximately plan view of manufacturing processes of the display apparatus in the first embodiment of the present invention, and illustrates processes up to the process of forming source and drain portions.
Figure 8B:
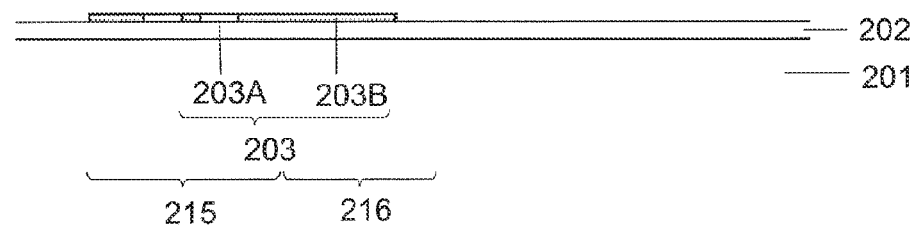
FIG. 8B is an approximately cross sectional view of manufacturing processes of the display apparatus in the first embodiment of the present invention, and illustrates processes up to the process of forming source and drain portions.

Next, as illustrated in FIGS. 7B and 8B, in order to form source and drain portions 203B, by a photolithography process, a resist pattern corresponding to the source and drain portions was formed, and boron was doped at a high concentration along it by ion doping. Then, via a resist removing process, the source and drain portion 203B and the channel portion 203A were formed on each of the islands of the polycrystalline silicon film 203. Here, a broken line in FIG. 7B illustrates a unit pixel.

Figure 7C:
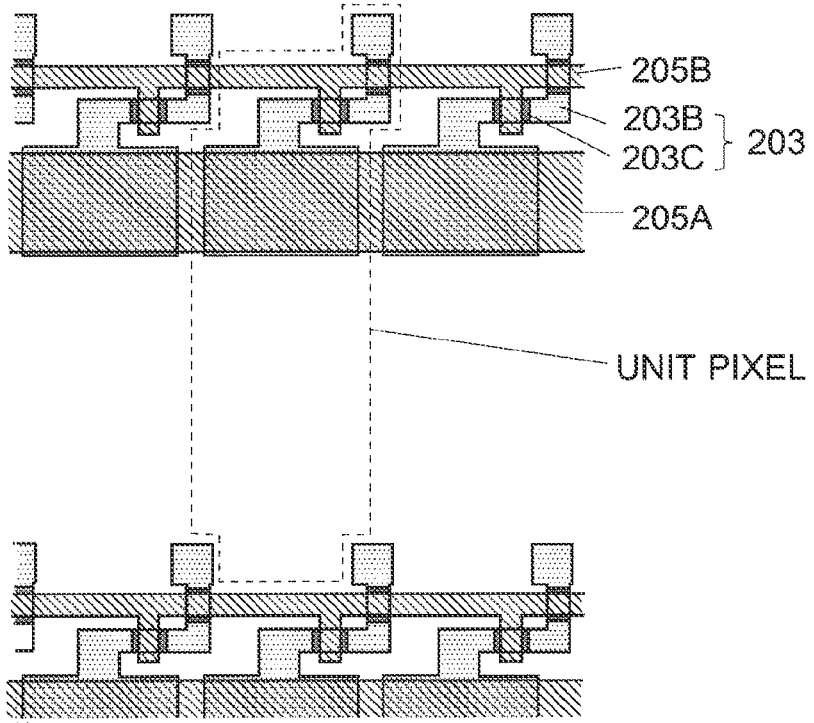
FIG. 7C is an approximately plan view of manufacturing processes of the display apparatus in the first embodiment of the present invention, and illustrates processes up to the process of forming gate wiring.
Figure 8C:
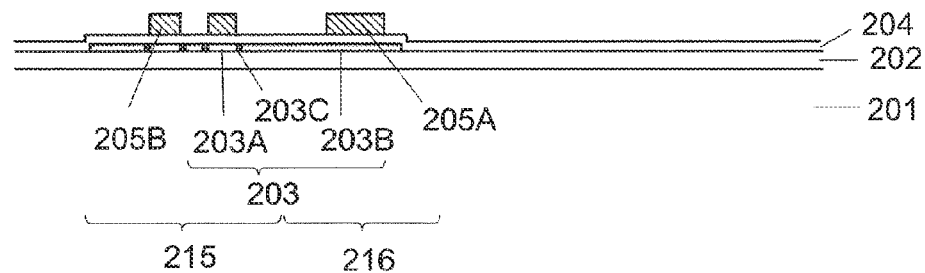
FIG. 8C is an approximately cross sectional view of manufacturing processes of the display apparatus in the first embodiment of the present invention, and illustrates processes up to the process of forming gate wiring.

Next, as illustrated in FIGS. 7C and 8C, by a PECVD method, as a gate insulating film 204, a silicon oxide film (120 nm) was formed. Successively, by a DC spattering method, a chromium (Cr) film with a film thickness of 200 nm is formed. Further, by a photolithography process, a resist pattern of gate layers was formed, and wet etching was performed along it. Subsequently, via a resist removing process, gate wires 205B and gate capacitance lines 205A were formed. Here, the gate wire 205B serves also as a gate electrode of the TFT 215. Next, by using the gate wire 205B (gate electrode) as a mask, ion doping of boron was performed, whereby LDD portions 203C were formed. Here, a broken line in FIG. 7C illustrates a unit pixel.

Figure 7D:
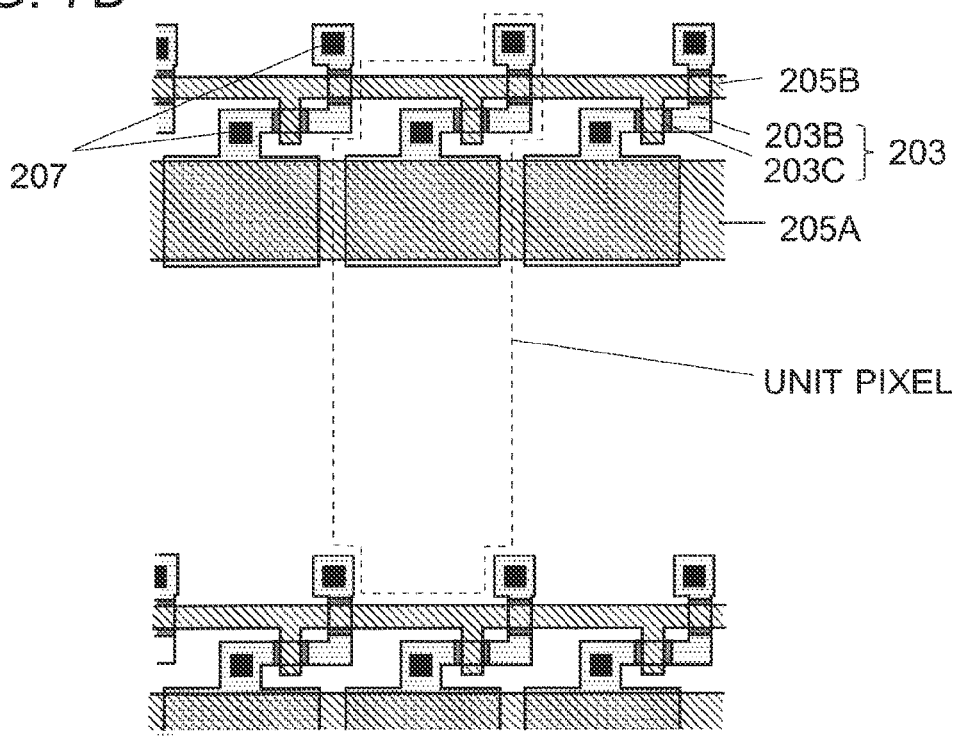
FIG. 7D is an approximately plan view of manufacturing processes of the display apparatus in the first embodiment of the present invention, and illustrates processes up to the process of forming first contact holes.
Figure 8D:
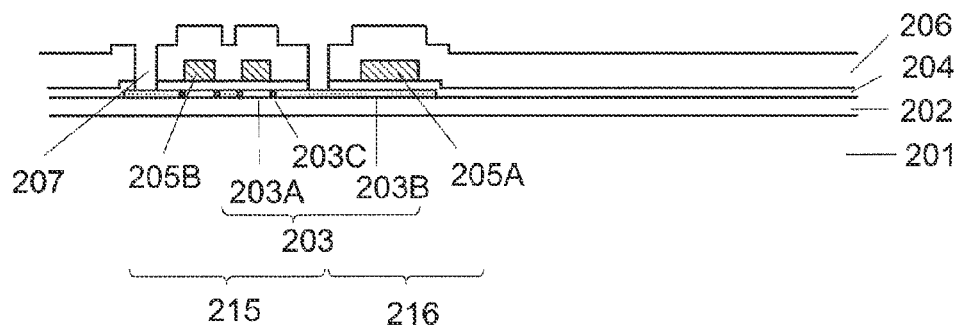
FIG. 8D is an approximately cross sectional view of manufacturing processes of the display apparatus in the first embodiment of the present invention, and illustrates processes up to the process of forming of first contact holes.

Next, as illustrated in FIGS. 7D and 8D, as the first interlayer insulating film 206, by a PECVD method, a silicon oxide film (440 nm) was formed, and then, in order to activate impurities doped on the source and drain portions 203B and the LDD portions 203C, heat treatment was performed at 450° C. Thereafter, by a photolithography process, a resist pattern of the first contact holes was formed, and dry etching was performed along it. Then, via a resist removing process, the first contact holes 207 for taking electric contact with the source and drain portions 203B composed of the polycrystalline silicon film and the gate electrode were formed. Here, a broken line in FIG. 7D illustrates a unit pixel.

Figure 7E:
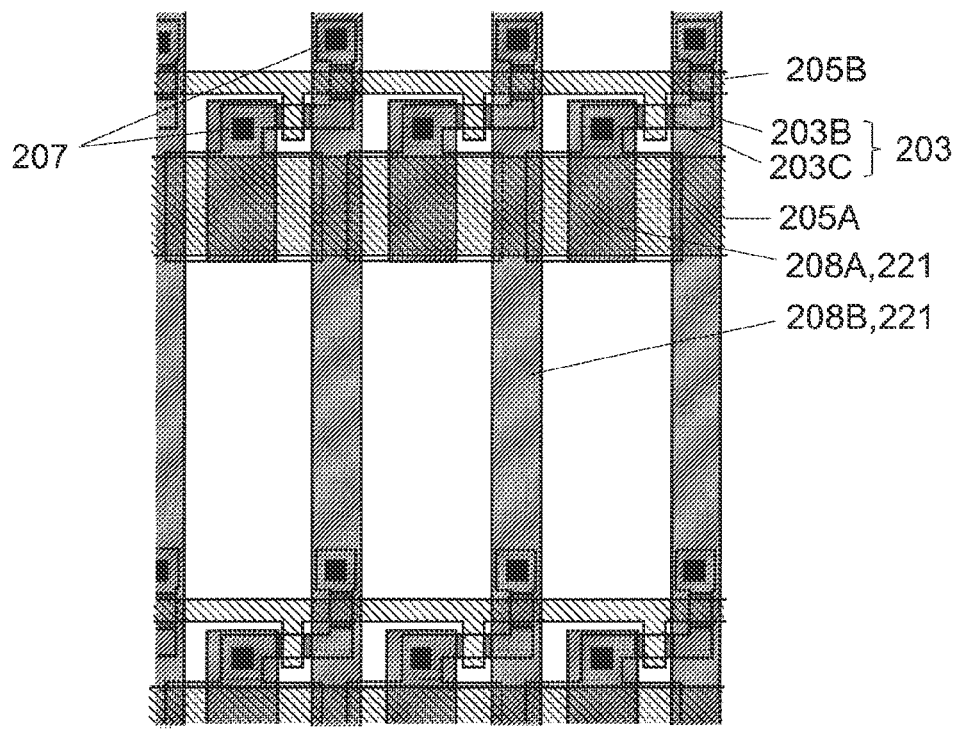
FIG. 7E is an approximately plan view of manufacturing processes of the display apparatus in the first embodiment of the present invention, and illustrates processes up to the process of forming drain wiring.
Figure 8E:
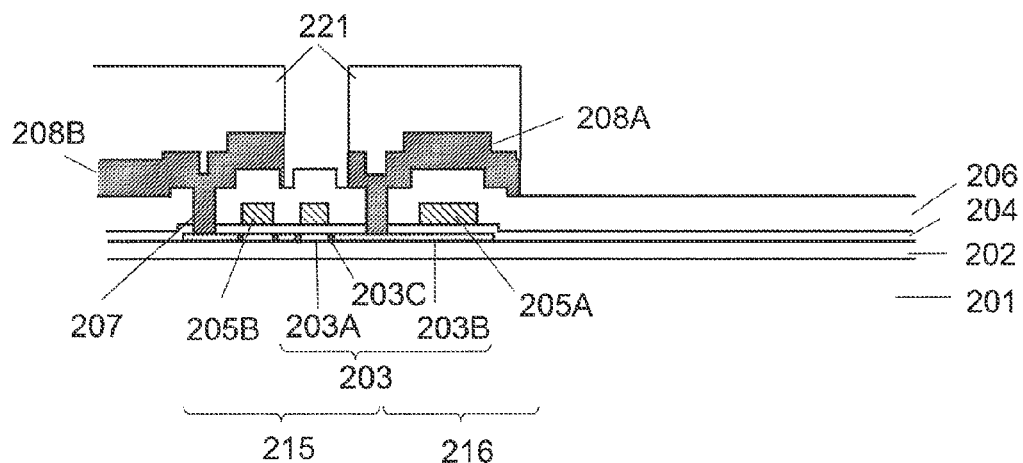
FIG. 8E is an approximately cross sectional view of manufacturing processes of the display apparatus in the first embodiment of the present invention, and illustrates processes up to the process forming drain wiring.

Next, as illustrated in FIGS. 7E and 8E, by a DC spattering method, a titanium (Ti) film with 25 nm thick, an aluminum (Al) film with 350 nm thick, and a titanium (Ti) film with 75 nm thick were formed. Thereafter, by a first photolithography process, a resist pattern 221 (pattern 1) of a drain layer of a drain wiring portion and a storage capacitance was formed, and by using a gas of $BCl_3/Cl_2$, dry etching was performed along it. Then, via a resist removing process, the drain wires 208B and the storage capacitance drain layer portions 208A were formed.

Figure 7F:
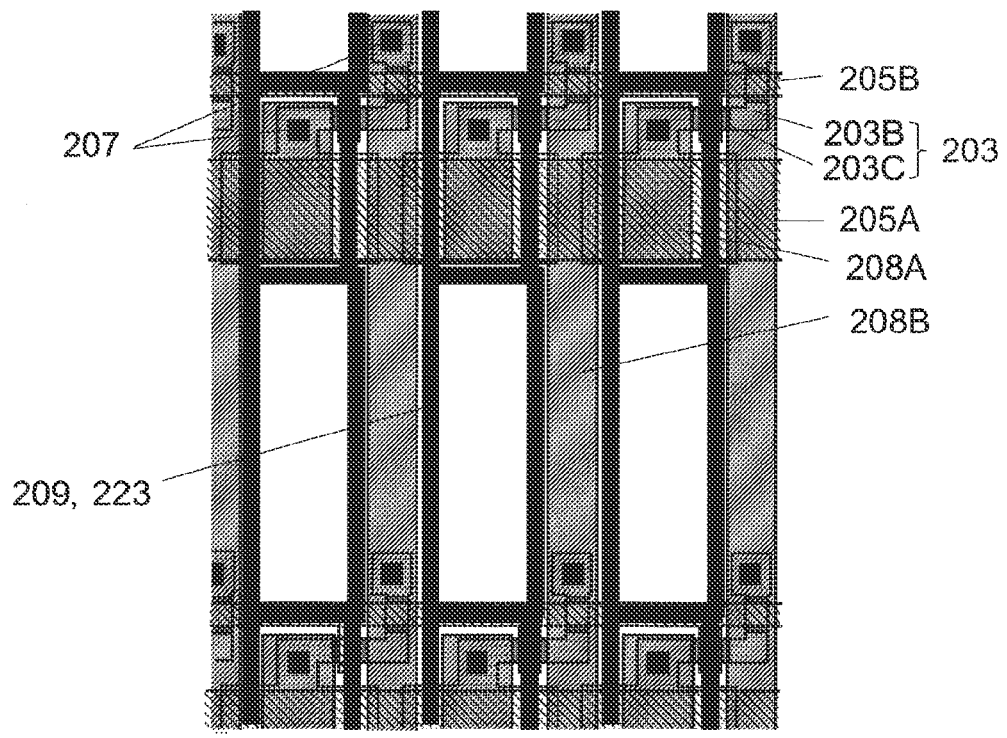
FIG. 7F is an approximately plan view of manufacturing processes of the display apparatus in the first embodiment of the present invention, and illustrates processes up to the process of forming a step on a first interlayer insulating film by the second dry etching.
Figure 8F:
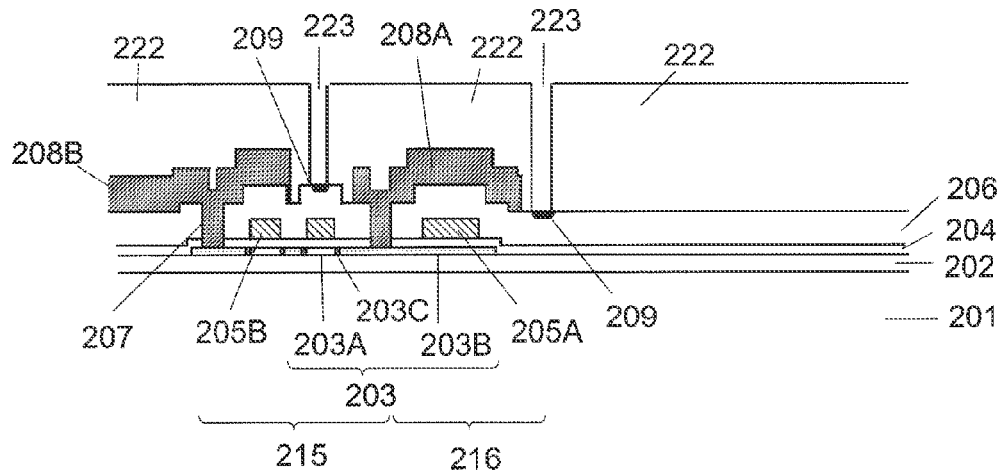
FIG. 8F is an approximately cross sectional view of manufacturing processes of the display apparatus in the first embodiment of the present invention, and illustrates processes up to the formation of a step on a first interlayer insulating film by the second dry etching.

Next, as illustrated in FIGS. 7F and 8F, by a photolithography process at the second time, a resist pattern 222 (pattern 2) and resist opening portions 223 were formed. The resist opening portions 223 were formed so as to enable the etching to be performed again for a range sandwiched between the drain wire 208B and the storage capacitance drain layer portion 208A, a portion between the storage capacitance drain layer portion 208A and the transmissive region 217, and the both sides of the drain wire 208B within the non-transmissive region 220. Further, the other portions including the transmissive region 217 were formed so as to be covered with a resist pattern 222. Then, along this resist pattern 222, by using a gas of $BCl_3/Cl_2$, dry etching was performed. Thereafter, via a resist removing process, zones 209 where the first interlayer insulating film is formed to be thinner than itself at the middle of the transmissive region were formed.

Further, as illustrated in FIGS. 7F and 8F, the resist opening portion 223 and the zones 209 where the first interlayer insulating film 206 is formed to be thinner than itself at the middle of the transmissive region, are made to avoid to be laid over the LDD portions 203C of each of the TFT, and formed so as to extend over the polycrystalline silicon film 203 on the gate wires 205B (that is, so as to extend over the channel portions 203A). With this, since it becomes possible to prevent a change of a fixed electric charge or a trap level in the first interlayer insulating film 206 on the LDD portions 203C, it becomes possible to prevent a change of the TFT characteristic due to a change of an LDD layer resistance. This matter is a very important point in order to maintain the symmetric property of a TFT characteristic, in the case where a Pixel TFT is a double gated mode as with this embodiment and a gate wire 205B and a LDD portion 203C at one side are located beneath the drain wire 208B. With this, while preventing effectively a short circuit between the drain wire 208B and the storage capacitance drain layer portion 208A, it becomes possible to prevent a change of the TFT characteristic due to a change of an LDD layer resistance.

Furthermore, on the resist opening portion 223 of the pattern 2 to form the zones 209 where the first interlayer insulating film is formed to be thinner than itself at the middle of the transmissive region, as illustrated in FIG. 7F, a non-closed configuration in the vicinity of each of the both sides of the drain wire 208B, or a slit configuration continuing from one end to another end in a unit pixel in the vicinity of each of the both sides of the drain wire 208B was disposed, and dry etching was performed along with this pattern 2. With this, each of the zones 209 where the first interlayer insulating film is formed to be thinner than itself at the middle of the transmissive region can be formed with a non-closed groove in the vicinity of each of the both sides of the drain wire 208B, or a groove bridging over in a unit pixel in the vicinity of each of the both sides of the drain wire 208B, whereby it becomes possible to prevent occurrence of line defects due to a short circuit between the neighboring drain wires 208B.

Although the width of each of the resist opening portion 223 of the pattern 2 and the zone 209 where the first interlayer insulating film is formed to be thinner than itself at the middle of the transmissive region was 3.0 μm in this embodiment, it is preferable that the width is 0.1 μm or more. The reason is that when a portion having not been separated at the time of the first dry etching is separated by the second dry etching, a distance capable of separating electrically securely is desired. In the case of this embodiment, the distance corresponds to a distance with which electrical separation can be made securely via a silicon nitride film formed at the next process.

Further, in the case of this embodiment, within a distance of about 5 μm by which the storage capacitance drain layer portion 208A and the drain wire 208B are separated from each other and at a position inner (the central side) by 1 μm from each of the storage capacitance drain layer portion 208A and the drain wire 208B, the resist opening portion 223 of the pattern 2 and the zone 209 where the first interlayer insulating film is formed to be thinner than itself at the middle of the transmissive region were formed. Further, the cross section of a difference in level (a stepped structure) formed at each of the resist opening portion 223 of the pattern 2 and the zone 209 where the first interlayer insulating film is formed to be thinner than itself at the middle of the transmissive region, was formed with a forward taper angle of 30 degrees.

The width of each of the resist opening portion 223 of the pattern 2 and the zone 209 where the first interlayer insulating film is formed to be thinner than itself at the middle of the transmissive region is preferably less than the distance by which the storage capacitance drain layer portion 208A and the drain wire 208B are separated from each other. Further, the cross section of the difference in level (the stepped structure) formed at each of the resist opening portion 223 of the pattern 2 and the zone 209 where the first interlayer insulating film is formed to be thinner than itself at the middle of the transmissive region is preferably formed so as to be provided with a forward taper angle less than 90 degrees. The reason is that by shaping the cross section of each of the storage capacitance drain layer portion 208A and the drain wire 208B into a substantially step-wise configuration, a change of coverage in the case of forming a film by a PECVD (Plasma Enhanced Chemical Vapor Deposition) at the next process, or a change of striation in the case of forming a coating layer at the next process can be suppressed to the minimum. With this, it becomes possible to prevent a change of the yield and reliability of a display apparatus due to a change of coverage, or a change of display quality such as display unevenness due to a change of striation.

Further, in the case where the taper angle of each of the storage capacitance drain layer portion 208A and the drain wire 208B is approximately vertical, if the zone 209 where the first interlayer insulating film is formed to be thinner than itself that middle of the transmissive region is shaped in this way, a side surface of the storage capacitance drain layer portion 208A positioned to face the transmissive region 217 and a lower portion of a side surface of the drain wire 208B positioned to face the transmissive region 217 are shaped to swell. Accordingly, an effect equivalent to that in the case of providing a forward taper angle is created. As compared with the case where the zone 209 where the first interlayer insulating film is formed to be thinner than the central portion of the transmissive region is not formed, in the above case, it becomes possible to rather improve the coatability of a film to be formed at the next process.

Further, as illustrated in FIGS. 7F and 8F, the resist opening portion 223 of the pattern 2 and the zone 209 where the first interlayer insulating film is formed to be thinner than itself at the middle of the transmissive region are formed with a slit-shaped pattern having the same width. With this, since dispersion due to the micro loading effect can be minimized, it becomes possible to control an amount of excavation into the first interlayer insulating film 206, whereby a change of the coatability of a steeped portion at the next process can be suppressed.

Further, the dry etching time at the time of forming along the pattern 2 the zone 209 where the first interlayer insulating film is formed to be thinner than itself at the middle of the transmissive region is preferably performed not shorter than the time with which a portion having been not separated at the time of the first dry etching can be separated by the second dry etching. In the case of this embodiment, a difference in level 225 being 170 nm was formed on the zone 209 where this first interlayer insulating film is formed to be thinner than the central portion of the transmissive region.

The experimental result about this difference in level is shown in TABLE 2. In the experiment, the etching time of the second time dry etching was varied so as to change a difference in level to be formed on the first interlayer insulating film, and investigation was made as to whether a portion having formed a short circuit at the time of the first dry etching was separated by the second dry etching. On the portion having been normally separated at the time of the first dry etching, an amount of excavation into the first interlayer insulating film has varied from 120 nm to 190 nm in response to the second dry etching time. According to this result, a portion of a short circuit was not able to be separated at the time of having formed a difference in level being 120 nm to 160 nm on the first interlayer insulating film. Therefore, in order to separate securely a portion having been not normally separated at the time of the first dry etching by the second dry etching, it is preferably to form a difference in level being 170 nm or more on the portion having been normally separated at the time of the first dry etching. With this, it becomes possible to prevent a short circuit between the drain wire 208B and the storage capacitance drain layer portion 208A and to prevent a short circuit between the neighboring drain wires 208B.

TABLE 2

| Experiment No. | Difference in level at a normal portion on the first interlayer insulating film (nm) | Judgment for separation on a short circuit portion (Yes: Separated, No: Not separated) |
| --- | --- | --- |
| 1 | 120 | No |
| 2 | 150 | No |
| 3 | 160 | No |
| 4 | 170 | Yes |
| 5 | 180 | Yes |
| 6 | 190 | Yes |

Further, since the entire surface of the transmissive region 217 was made to be covered with resist so as not be subjected to etching by the second dry etching, the amount of excavation into the first interlayer insulating film 206 at the transmissive region 217 does not increase. The film thickness of the first interlayer insulating film 206 never becomes thinner after the first dry etching. Also, the dispersion in the film thickness of the first interlayer insulating film 206 never becomes larger. Therefore, it becomes possible to suppress a change of the display quality of a display apparatus, in particular, a change of chromaticity at the time of displaying white.

Figure 7G:
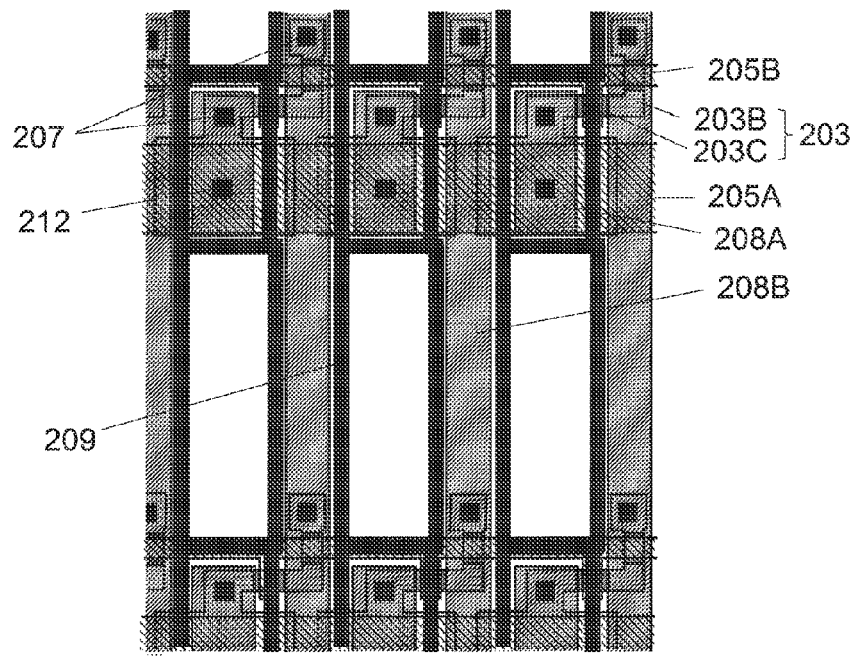
FIG. 7G is an approximately plan view of manufacturing processes of the display apparatus in the first embodiment of the present invention, and illustrates processes up to the process of forming second contact holes.
Figure 8G:
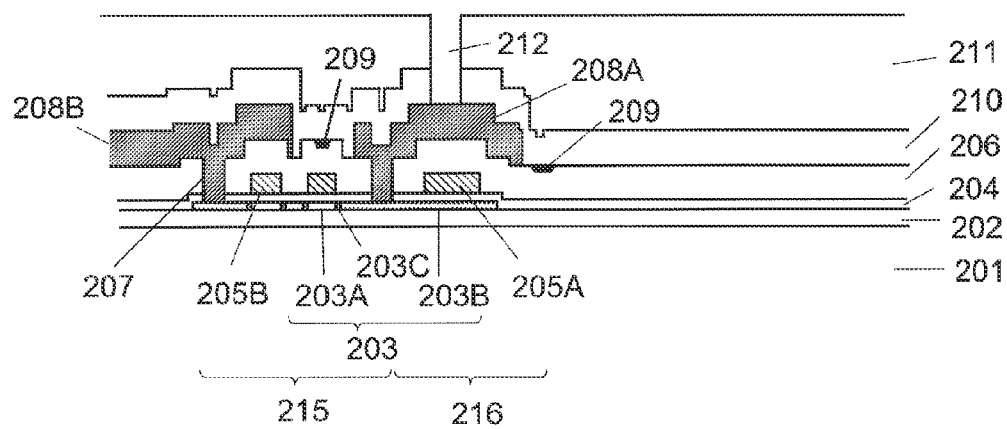
FIG. 8G is an approximately cross sectional view of manufacturing processes of the display apparatus in the first embodiment of the present invention, and illustrates processes up to the process of forming second contact holes.

Next, as illustrated in FIGS. 7G and 8G, a silicon nitride film (400 nm) was formed as a second interlayer insulating film 210 by a PECVD method, and followed by annealing at 300° C. and hydrogenation. Further, on the film, an organic layer 211 was coated by spin-coating, and followed by calcinating, whereby the film with a thickness of about 1 μm was formed. Subsequently, according to a photolithography process, a resist pattern of second contact holes was formed, and then, dry etching was performed along it. Thereafter, via a resist removing process, the second contact holes 212 for taking electrical contact with a drain layer were formed.

Figure 8H:
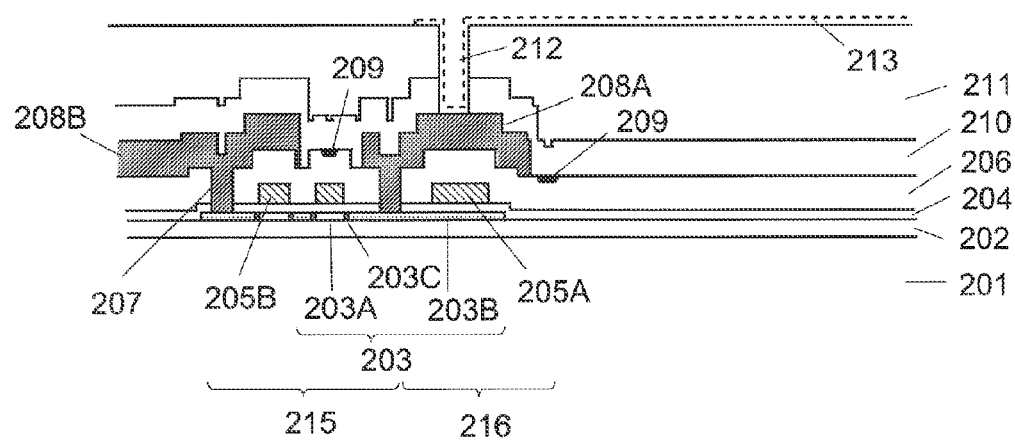
FIG. 8H is an approximately cross sectional view of manufacturing processes of the display apparatus in the first embodiment of the present invention, and illustrates processes up to the formation of pixel electrodes.

Next, as illustrated in FIGS. 4A and 8H, further, an ITO film (40 nm) was formed by a DC spattering method. Then, according to a photolithography process, a resist pattern of a pixel electrode was formed, and wet etching was performed along it. Thereafter, via a resist removing process, the pixel electrode 213 was formed, whereby the TFT substrate 101 as illustrated in FIG. 4A was obtained.

On the other hand, with regard to the counter substrate, on the glass substrate 301, a chromium film (140 nm) was formed by a DC spattering method. Successively, on the film, according to a photolithography process, a resist pattern of a light shielding layer was formed, and wet etching was performed along it. Thereafter, via a resist removing process, the black matrix 302 was formed.

Next, a color resist layer 303 in which pigment etc. were dispersed was formed, and further, an ITO film (40 nm) was formed by a DC spattering method, and a counter electrode 304 was formed, whereby the counter substrate 102 was obtained.

Next, on the entire surface of each of the pixel electrode 213 of the TFT substrate 101 and the counter electrode 304 of the counter substrate 102, the orienting films 103 (214) and 104 (305) composed of polyimide were coated by printing. Successively, the orienting films were subjected to a rubbing process so as to provide an orienting axis with an angle of 90 degrees when the both substrates 101 and 102 were made to face to each other. Thereafter, the both substrates 101 and 102 were assembled so as to face to each other, and made into a cell. Into a space between the substrates 101 and 102, a nematic liquid crystal 105 was filled and sealed. Further, on the respective glass substrate sides of the substrates 101 and 102, the polarizing plates 106 and 107 were pasted separately, whereby a liquid crystal display apparatus 100 was obtained.

As mentioned above, by employing the structure and manufacturing method of this embodiment, while preventing a change of chromaticity due to a change of the thickness of an insulating film in a transmissive region of a display apparatus and a change of the display quality due to a change of the TFT characteristic, it becomes possible to prevent occurrence of point defects and line defects due to a short circuit between electric conductive film patterns and to increase the yield. Simultaneously, it becomes possible to suppress a change of the display quality and a change of the reliability due to a change of the coatability of a film on a conductive film.

Embodiment 2

This embodiment differs from the first embodiment in the following points. In a plan view in FIG. 9 and a cross sectional view in FIG. 10 (taken along the X-X line in FIG. 9), at only one side of the drain wire 208B of the wiring section 219, for the drain wire 208B and the storage capacitance drain layer portion 208A, photolithography and dry etching were performed two times, and the zone 209 where the first interlayer insulating film 206 is formed to be thinner than the central portion of the transmissive region was formed by a groove.

With this, the probability capable of preventing the line defects due to a short circuit between the neighboring drain wires 208B in the wiring section 219 may decrease a little. However, the point defects due to a short circuit between the drain wire 208B and the storage capacitance drain layer portion 208A can be prevented as with the first embodiment.

Further, as compared with the first embodiment, since the area of the zone 209 where the first interlayer insulating film 206 is formed to be thinner than itself at the middle of the transmissive region can be made small, the area of the transmissive region 217 can be made wider. Therefore, as compared with the first embodiment, the transmittance of a display apparatus can be increased.

Furthermore, as with the first embodiment, since the entire surface of the transmissive region 217 was made to be covered with resist so as not be subjected to etching by the second dry etching, the amount of excavation into the first interlayer insulating film 206 of the transmissive region 217 does not increase. The film thickness of the first interlayer insulating film 206 never becomes thinner after the first dry etching. Also, the dispersion in the film thickness of the first interlayer insulating film 206 never becomes larger. Therefore, it becomes possible to suppress a change of the display quality of a display apparatus, in particular, a change of chromaticity at the time of displaying white.

As mentioned above, by employing the structure and manufacturing method of this embodiment, while preventing a change of chromaticity due to a change of the thickness of an insulating film in a transmissive region of a display apparatus and a change of a display quality due to a change of the TFT characteristic, it becomes possible to prevent occurrence of point defects and line defects due to a short circuit between electric conductive film patterns and to increase the yield. Simultaneously, it becomes possible to suppress a change of the display quality and a change of the reliability due to a change of the coatability of a film on a conductive film. In addition, it becomes possible to increase the transmittance of a panel.

Embodiment 3

This embodiment differs from the first and second embodiments in the following points. In a plan view in FIG. 11, a cross sectional view in FIG. 12 (taken along the XII-XII line in FIG. 11) and a cross sectional view in FIG. 13 (taken along the XIII-XIII line in FIG. 11), on a part of the transmissive region 217 of a display apparatus, for the drain wire 208B and the storage capacitance drain layer portion 208A, photolithography and dry etching were performed two times, whereby a zone 209B where the first interlayer insulating film 206 is formed to be thinner than itself at the middle of the transmissive region was formed. Therefore, as compared with the first and second embodiments, the transmissive region 217 can be made wider, and the transmittance of a panel of the display apparatus can be increased.

Figure 11:
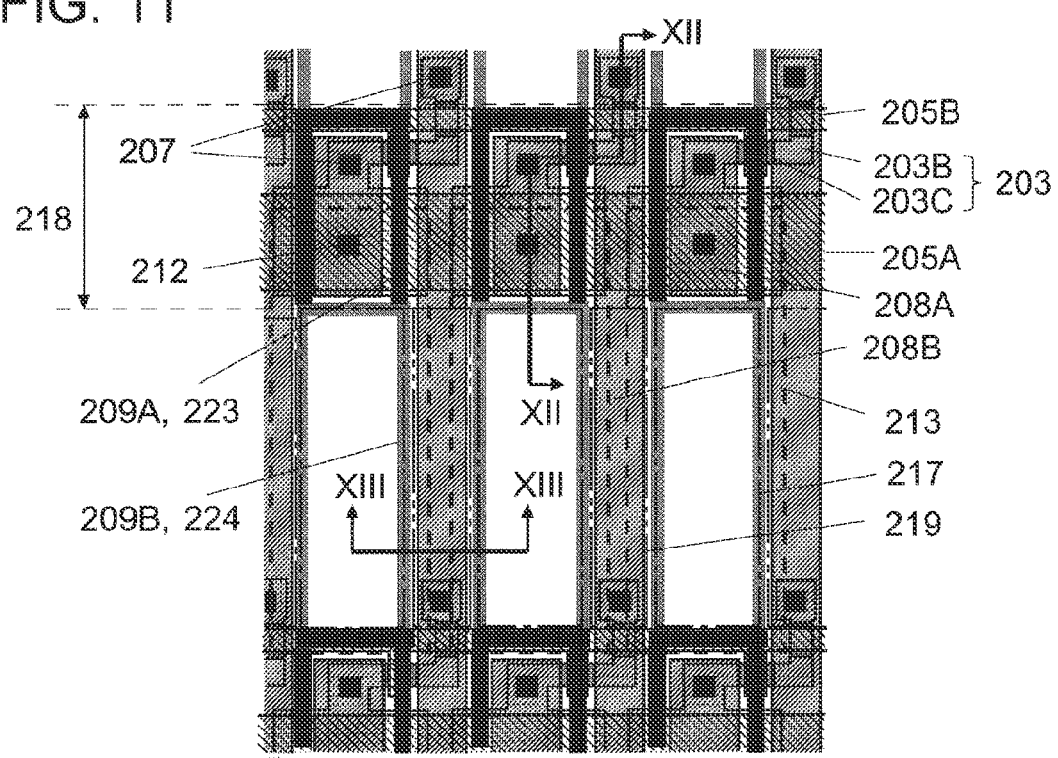
FIG. 11 is an approximately plan view of a pixel area of a display apparatus in the third embodiment of the present invention.

However, the width of the zone 209B where the first interlayer insulating film 206 is formed to be thinner than itself at the middle of the transmissive region is made small as far as possible, and is made equal to or less than the width of a zone 209A wherein the first interlayer insulating film 206 is formed to be thinner than itself at the middle of the transmissive region in the non-transmissive region 220, and the zone 209B is formed on the peripheral edge portion of the transmissive region 217. Further, therefore, as illustrated in FIG. 11, the width of the resist opening portion 224 to form the zone 209B where the first interlayer insulating film is formed to be thinner than itself at the middle of the transmissive region in the peripheral edge portion of the transmissive region 217 is formed to be equal to or less than the width of the resist opening portion 223 in the non-transmissive region 220. With this, since dispersion due to the micro loading effect can be minimized, it becomes possible to control an amount of excavation into the first interlayer insulating film 206. Therefore, it becomes possible to suppress a change of the display quality of a display apparatus, in particular, a change of chromaticity at the time of displaying white.

As mentioned above, by employing the structure and manufacturing method of this embodiment, while suppressing a change of chromaticity due to a change of the thickness of an insulating film in a transmissive region of a display apparatus to the minimum, it becomes possible to prevent a change of a display quality due to a change of the TFT characteristic, to prevent occurrence of point defects and line defects due to a short circuit between electric conductive film patterns, and to increase the yield. Simultaneously, it becomes possible to suppress a change of the display quality and a change of the reliability due to a change of the coatability of a film on a conductive film to the minimum. In addition, it becomes possible to increase the transmittance of a panel.

While the first to third embodiments have been described using specific terms, such description is for illustrative purpose only, and it is to be understood that changes and variations may be made without depending from the spirit or scope of the appended claims.

For example, in the first to third embodiments, description has been given to the example to prevent a short circuit of the drain layer of the transmissive liquid crystal display apparatus employing the polycrystalline silicon TFT. However, the present invention should not be limited to the above embodiments, and the present invention can be applied similarly to a gate layer and a polycrystalline silicon layer. Further, the switching element of a pixel should not be limited to the polycrystalline silicon TFT, and it can be applied to other TFTs such as a-Si TFT and an oxide semiconductor TFT. Moreover, the present invention should not be limited to the transmissive liquid crystal display apparatus, and the present invention can be applied to a display apparatus in which light rays pass through a part of a TFT substrate, such as a semi-transmissive liquid crystal display apparatus, a bottom-emitting AMOLED, and the like.

The invention claimed is:

1. A display apparatus comprising:
a counter substrate including a light shielding layer defining transmissive regions where light passes through and non-transmissive regions where light does not pass through; and
an active matrix substrate including a pixel area where pixels are arranged in matrix, each of the pixels including the transmissive region and the non-transmissive region both defined by the light shielding layer,
wherein the active matrix substrate includes, in the non-transmissive region of each of the pixels,
a transparent substrate,
a polycrystalline silicon film formed on the transparent substrate, the polycrystalline silicon film including a channel portion, a lightly doped drain (LDD) portion, and source and drain portions,
a gate insulating film formed on the polycrystalline silicon film,
a gate electrode formed on the gate insulating film and covering the channel portion,
an interlayer insulating film formed on the gate electrode, and
a drain layer formed on the interlayer insulating film and including patterned conductive films at least partially covering the source and drain portions respectively,
the active matrix substrate includes, in the transparent region of each of the pixels,
the transparent substrate, and
the gate insulating film and the interlayer insulating film both formed on the transparent substrate, and
the interlayer insulating film includes zones where the interlayer insulating film is thinner than a part of the interlayer insulating film at a middle of each of the transmissive regions, the zones each being located so as to extend between the patterned conductive films neighboring to each other, the zones further being located so as not to overlap with the transmissive regions and regions laid over the LDD portions.

2. The display apparatus of claim 1,
wherein each of the zones includes a groove being not closed in a vicinity of the patterned conductive films of the drain layer.

3. The display apparatus of claim 1,
wherein each of the zones includes a groove continuing between opposite ends of the pixel area, in a vicinity of the patterned conductive films of the drain layer.

4. The display apparatus of claim 1,
wherein each of the zones has a same width over the non-transmissive regions.

5. The display apparatus of claim 1,
wherein each of the zones has a width being 0.1 µm or more and being less than a gap between the patterned conductive films separately formed in the drain layer.

6. The display apparatus of claim 1,
wherein each of the zones has a difference in level at a boundary thereof so as to form the each of the zones into a tapered shape in a depth direction at a forward taper angle less than 90 degrees.

7. The display apparatus of claim 1,
wherein each of the zones has a difference in level at a boundary thereof, the difference being 170 nm or more.

8. The display apparatus of claim 1,
wherein the drain layer includes a patterned island and a wire for transmitting signals to the pixels as the patterned conductive films, the patterned island and the wire at least partially covering the source and drain portions respectively, and
the zones of the interlayer insulating film are located so as to extend between the patterned island and the wire neighboring to each other and to be put at one side or both sides of each of the wires.

9. A display apparatus comprising:
a counter substrate including a light shielding layer defining transmissive regions where light passes through and non-transmissive regions where light does not pass through; and
an active matrix substrate including a pixel area where pixels are arranged in matrix, each of the pixels including the transmissive region and the non-transmissive region both defined by the light shielding layer,
wherein the active matrix substrate includes, in the non-transmissive region of each of the pixels,
a transparent substrate,
a polycrystalline silicon film formed on the transparent substrate, the polycrystalline silicon film including a channel portion, a lightly doped drain (LDD) portion, and source and drain portions,
a gate insulating film formed on the polycrystalline silicon film,
a gate electrode formed on the gate insulating film and covering the channel portion,
an interlayer insulating film formed on the gate electrode, and
a drain layer formed on the interlayer insulating film and including patterned conductive films at least partially covering the source and drain portions respectively,
the active matrix substrate includes, in the transparent region of each of the pixels,
the transparent substrate, and
the gate insulating film and the interlayer insulating film both formed on the transparent substrate, and
the interlayer insulating film includes zones where the interlayer insulating film is thinner than a part of the interlayer insulating film at a middle of each of the transmissive regions, the zones being located in a first area and a second area, the first area being located so as to extend between the patterned conductive films neighboring to each other and not to overlap with regions laid over the LDD portions, the second area being peripheries of the transmissive regions, each of the zones in the second area being equal or less in width than the each of the zones in the first area.

\* \* \* \* \*